(12) United States Patent
Kataoka

(10) Patent No.: US 8,704,685 B2
(45) Date of Patent: Apr. 22, 2014

(54) ENCODING METHOD, ENCODING APPARATUS, DECODING METHOD, DECODING APPARATUS, AND SYSTEM

(71) Applicant: Fujitsu Limited, Kawasaki (JP)

(72) Inventor: Masahiro Kataoka, Tama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/722,206

(22) Filed: Dec. 20, 2012

(65) Prior Publication Data

US 2013/0181851 A1    Jul. 18, 2013

(30) Foreign Application Priority Data

Jan. 17, 2012  (JP) ................. 2012-006860

(51) Int. Cl.
*H03M 7/34* (2006.01)
*H03M 7/30* (2006.01)

(52) U.S. Cl.
CPC .................. *H03M 7/3084* (2013.01)
USPC ............................. 341/51; 341/50

(58) Field of Classification Search
USPC .......................... 341/50, 51, 67, 65
See application file for complete search history.

(56) References Cited

U.S. PATENT DOCUMENTS

| | | | |
|---|---|---|---|
| 5,764,658 A * | 6/1998 | Sekiguchi et al. | 714/752 |
| 6,522,268 B2 * | 2/2003 | Belu | 341/51 |
| 6,906,644 B2 * | 6/2005 | Satoh | 341/51 |
| 7,436,876 B2 * | 10/2008 | Fisher et al. | 375/130 |
| 7,519,577 B2 * | 4/2009 | Brundage et al. | 1/1 |
| 2006/0126949 A1 * | 6/2006 | Lee et al. | 382/232 |
| 2010/0085222 A1 | 4/2010 | Kataoka et al. | |

FOREIGN PATENT DOCUMENTS

JP    2010-93414    4/2010

* cited by examiner

*Primary Examiner* — Peguy Jean Pierre
(74) *Attorney, Agent, or Firm* — Staas & Halsey LLP

(57) ABSTRACT

An encoding method includes searching a search target symbol string within a specific range from the end of a symbol string, which has been utilized for encoding, for a match symbol string corresponding to a beginning symbol string of a symbol string to be encoded, encoding the beginning symbol string based on a distance between the match symbol string and the beginning symbol string, and a length of the match symbol string.

19 Claims, 35 Drawing Sheets

```
<number>790269</number><name>Masahiro KATAOKA</name><addr>..., xxx-ku, Yokohama-shi, Kanagawa-ken</addr><age>...
<number>810538</number><name>Masamitsu KATAOKA</name><addr>..., Tama-shi, ..., Tokyo</addr><age>...
<number>980632</number><name>xxxx KAWABATA</name><addr>..., xxx-ku, Kawasaki-shi, Kanagawa-ken</addr>
<number>930328</number><name>yyyy KIMURA</name><addr>..., Inagi-shi, Tokyo</addr>
<number>770827</number><name>xxyy TANIGAWA</name><addr>..., xxx-ku, Yokohama-shi, Kanagawa-ken</addr>
```

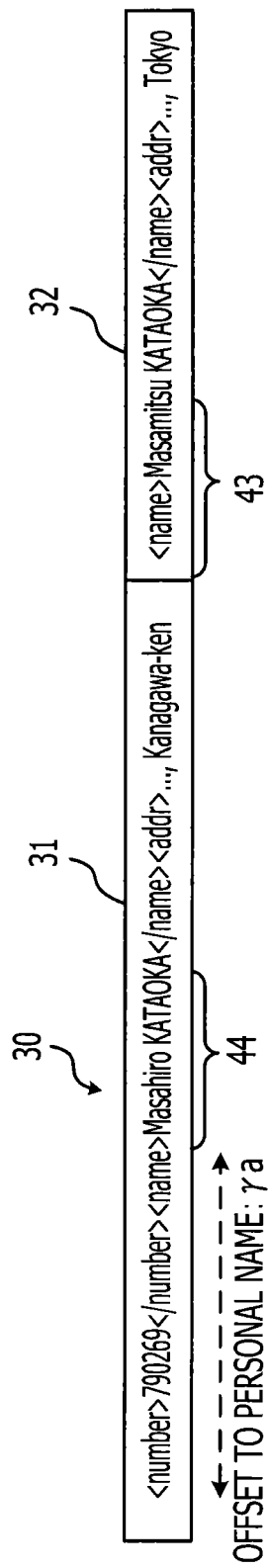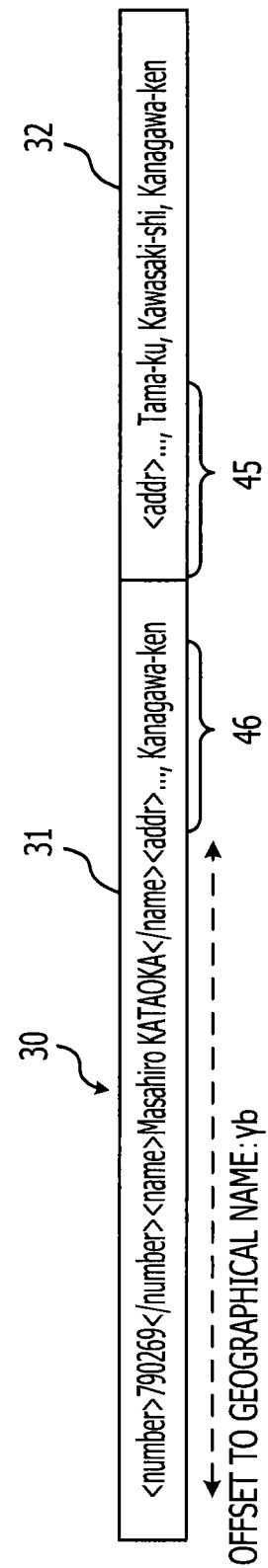

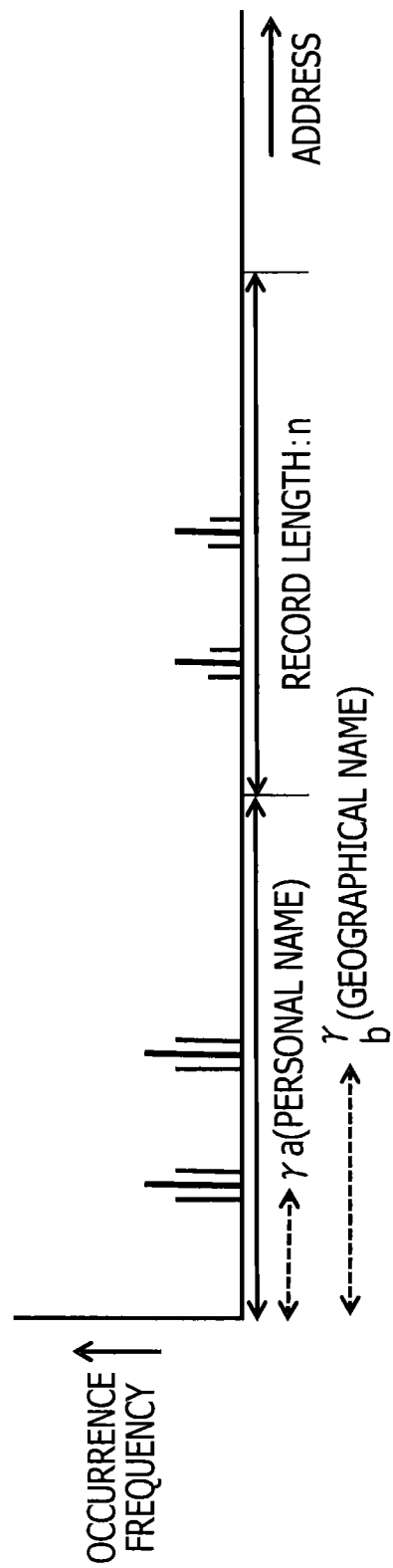

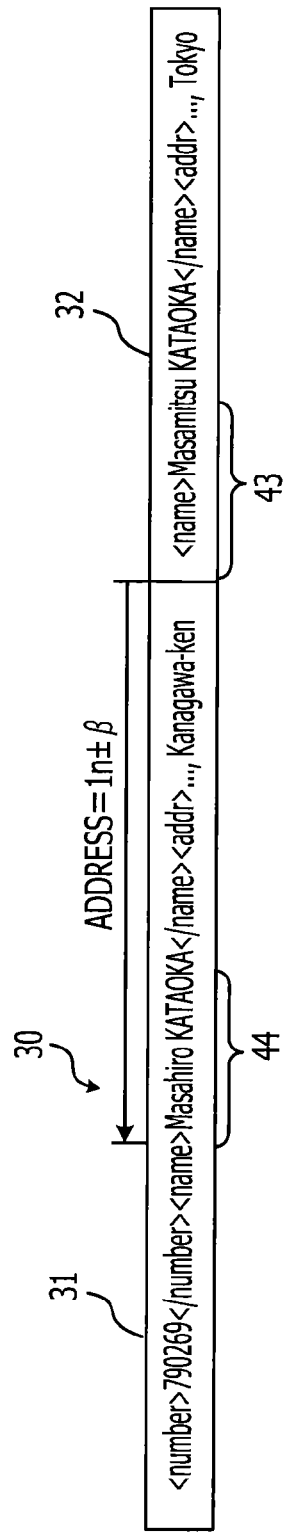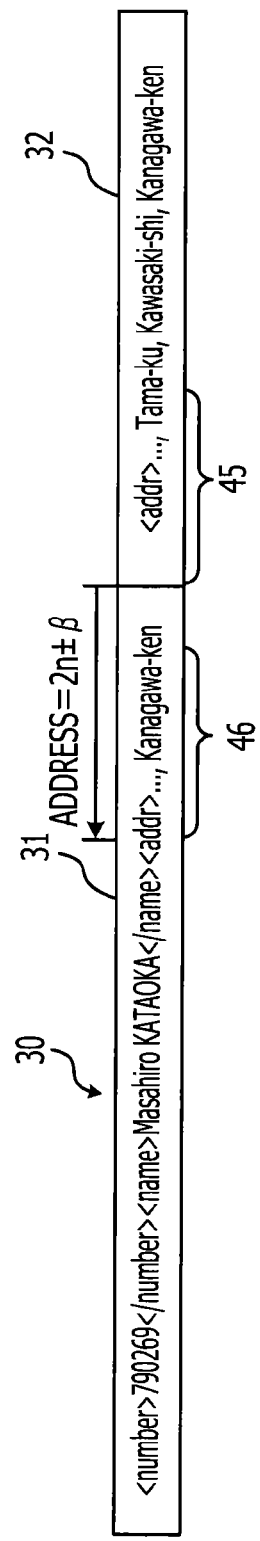

FIG. 31

| TYPE | RANGE OF INTEGER | COMPRESSION AND DECOMPRESSION TARGET BITS | COMPRESSION OR DECOMPRESSION COUNT |
|---|---|---|---|
| HIGH-FREQUENCY INTEGER | 1~128 | 1~7 | ONCE |
| LOW-FREQUENCY INTEGER | 129~1024 | 8~10 | TWICE |
| | 1025~8192 | 11~13 | THREE TIMES |

FIG. 34

| INTEGER | OCCURRENCE COUNT | OCCURRENCE FREQUENCY | CORRECTION PROBABILITY | CODE LENGTH | COMPRESSION CODE |
|---|---|---|---|---|---|
| 1 | n1 | 0.137 | 1/8 | 3 | 000 |
| 2 | n2 | 0.074 | 1/16 | 4 | 0010 |
| ⋮ | ⋮ | ⋮ | ⋮ | ⋮ | ⋮ |

US 8,704,685 B2

ENCODING METHOD, ENCODING APPARATUS, DECODING METHOD, DECODING APPARATUS, AND SYSTEM

CROSS-REFERENCE TO RELATED APPLICATIONS

This application is based upon and claims the benefit of priority of the prior Japanese Patent Application No. 2012-6860, filed on Jan. 17, 2012, the entire contents of which are incorporated herein by reference.

FIELD

The embodiments discussed herein are related to data transform.

BACKGROUND

Data compression techniques include Huffman coding, LZ77 coding, and LZ78 coding. Improvements of LZ77 coding includes LZSS coding. Also available are compression algorithms in ZIP format or LZH format, in which data compressed through LZSS is further compressed through Huffman coding.

In the LZ77 coding or LZSS coding, a dictionary is generated using a method referred to as a sliding dictionary method. In the sliding dictionary method, a buffer area called a sliding window is used. A character string is stored as an encoding target in the sliding window in the reading order thereof. When the sliding window becomes full of character strings, the oldest character string is discarded first.

The area of the sliding window is partitioned into a reference region and encoding region. A character string stored in the reference region is used as a dictionary, and a character string stored in the encoding region is encoded. The character string thus encoded is stored on the reference region. In encoding, a character string (the longest match character string) that has the longest match pattern with a leading character string in the encoding region is searched for in the reference region. The character string in the encoding region is encoded into values indicating a distance (address) from the front of the sliding window to the front of the longest match character string and a length of the longest match character string. A high compression rate is thus achieved. If the length of the longest match symbol string is shorter than three characters, the leading character of the encoding region is output in binary notation (such as American standard code for information interchange (ASCII) code).

In ZIP, or LZH, a leading address, length, and binary notation of a character, each encoded, are compressed using a Huffman tree. The compression rate is even more increased.

A technique available in the Huffman coding converts the Huffman tress into a nodeless tree, thereby increasing the compression efficiency of character code and allowing a compress process and a decompression process to be performed at a high speed.

Integers of an address and a length resulting from encoding through the related-art sliding dictionary method are not values optimized for an encoding method that is used in the encoding of the integers. Even if an integer resulting from encoding through the sliding dictionary method is encoded using the Huffman code, no sufficient compression rate results.

SUMMARY

According to an aspect of the invention, an encoding method includes searching a search target symbol string within a specific range from the end of a symbol string, which has been utilized for encoding, for a match symbol string corresponding to a beginning symbol string of a symbol string to be encoded, encoding the beginning symbol string based on a distance between the match symbol string and the beginning symbol string, and a length of the match symbol string.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an example of character strings in an original file.

FIG. 7A illustrates the address modification of the longest match character string performed in accordance with the offset from the front of the sliding window.

FIG. 7B illustrates the address modification of the longest match character string performed in accordance with the offset from the front of the sliding window.

FIG. 8 illustrates a distribution example of addresses when the address modification is performed on the longest match character string with an offset from the front of the sliding window.

FIG. 9A illustrates an address modification that is performed on the longest match character string with an offset from the end of a reference region.

FIG. 9B illustrates an address modification that is performed on the longest match character string with an offset from the end of a reference region.

FIG. 31 illustrates an example of compression and decompression counts in the division of the low-frequency integers.

FIG. 34 illustrates an example of a relationship between an occurrence frequency of the integer and a code length.

DESCRIPTION OF EMBODIMENTS

Embodiments are described with reference to the drawings. The embodiments may be implemented in combination on condition that no inconsistency is caused in the operation of the combined embodiments.

A first embodiment is described. The first embodiment is intended to increase localization in the occurrence frequency of the integer resulting from encoding through the sliding dictionary method. An encoding method with the localization introduced in the occurrence frequency of the integer encodes a code having a high occurrence frequency into a shorter code. The encoding method thus allows more integers to be encoded into shorter codes, thereby increasing a compression rate.

Figure 1:
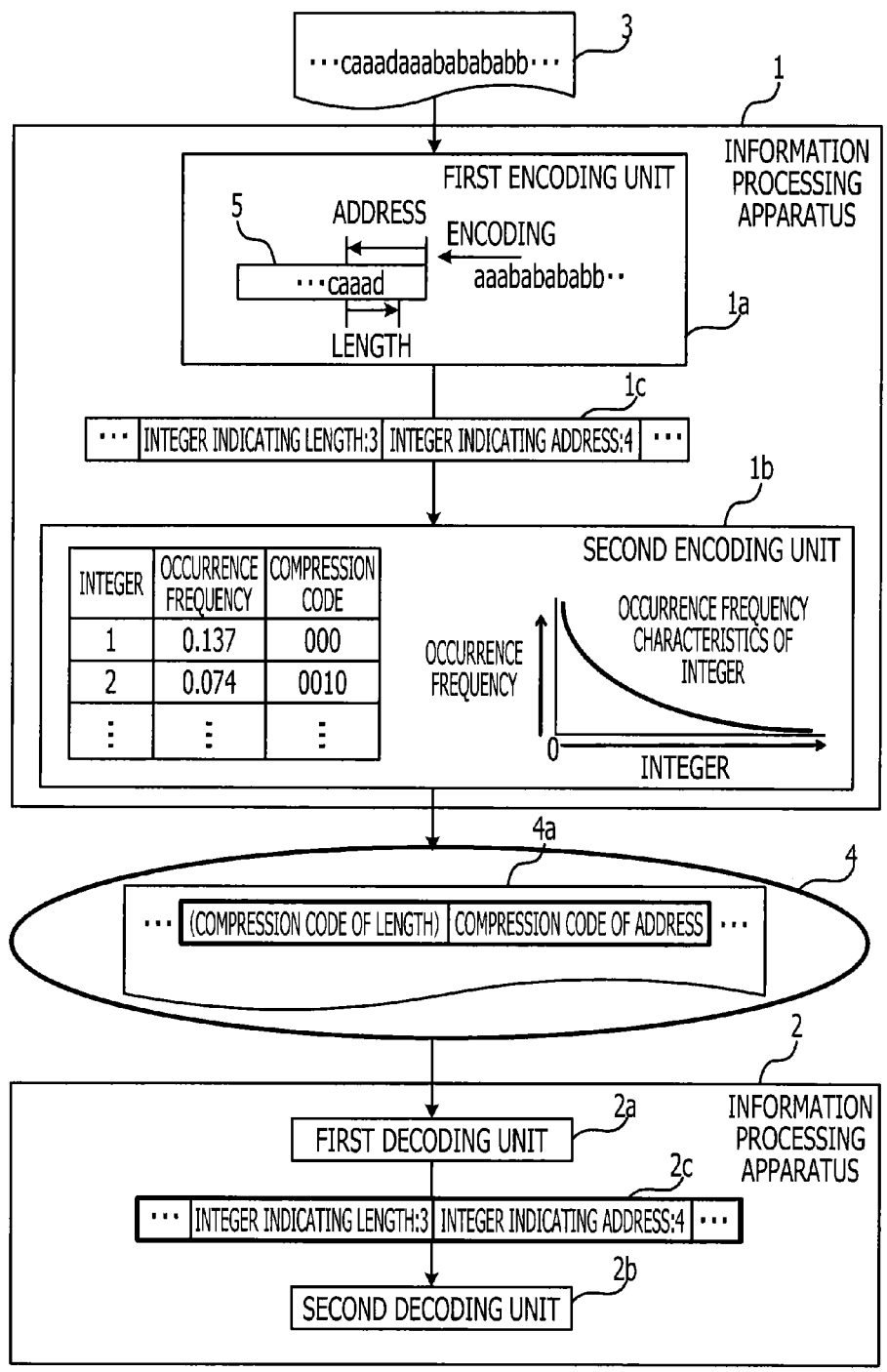
FIG. 1 is a functional block diagram of a system of a first embodiment.

FIG. 1 illustrates a functional structure of a system of a first embodiment. As illustrated in FIG. 1, a compression file 4a generated by an information processing apparatus 1 is decompressed by another information processing apparatus 2.

The information processing apparatus 1 includes a first encoding unit 1a and a second encoding unit 1b to compress a symbol string in an original file 3.

The first encoding unit 1a searches, as a search target, symbol strings within a specific range from the end of a symbol string that has undergone (has been utilized for) encoding for the longest match symbol string that has the longest match pattern with a leading symbol string of symbol strings that have not undergone encoding. The symbol strings within the specific range from the end of the symbol string that has undergone encoding are stored on a buffer 5. The symbol strings on the buffer 5 are updated by the first encoding unit 1a each time the encoding of a new symbol string is completed.

More specifically, the first encoding unit 1a searches, as a search target, symbol strings in a reference region of a sliding window of a sliding dictionary method for the longest match symbol string having the longest match pattern with a leading symbol string of symbol strings in an encoding region.

The first encoding unit 1a then sets an integer indicating a distance (offset) from the end of the symbol string having undergone encoding to the longest match symbol string to be an address of the longest match symbol string. The first encoding unit 1a encodes the leading symbol string of the symbol strings that have not undergone encoding corresponding to the longest match symbol string into an integer indicating the address and an integer indicating a length of the longest match symbol string. For example, an intermediate code including the integer indicating the length and the integer indicating the address is thus generated. A string of intermediate codes generated by the first encoding unit 1a (intermediate code string 1c) is transmitted to the second encoding unit 1b.

The second encoding unit 1b encodes the integer indicating the address and the integer indicating the length in a manner such that each integer having a higher occurrence frequency is encoded into a shorter code. For example, Huffman coding is available as an encoding method that causes the integer having a higher occurrence frequency to be encoded into a shorter code. The second encoding unit 1b calculates the occurrence frequency of the integer indicated by the intermediate code string 1c received from the first encoding unit 1a. The second encoding unit 1b then assigns each integer to a leaf to generate a Huffman tree. In accordance with the occurrence frequency of the integer, the second encoding unit 1b generates a node over the leaf, and thus generates the Huffman tree. In the Huffman tree, a layout of labels attached to a path extending from the root to the leaf becomes a code corresponding to the integer assigned to the leaf. The second encoding unit 1b encodes the integer indicating the length and the integer indicating the address, and then stores the encoded integers on the compression file 4a. The second encoding unit 1b then stores the compression file 4a on a recording medium 4. The second encoding unit 1b may also store information indicating the occurrence frequency of each integer on the recording medium 4.

The recording medium 4 is a computer readable memory. The compression file 4a stored on the recording medium 4 may be read by the information processing apparatus 2. The compression file 4a stored on the recording medium 4 has a data structure described below.

The compression file 4a includes a compression code into which an integer is encoded so that the integer having a higher occurrence frequency is encoded into a shorter code. The integers serving as an original of the compression code includes an integer indicating an address of the longest match symbol string having the longest match pattern with the leading symbol string of the symbol strings that have not undergone encoding, out of the symbol strings within the specific range from the end of the symbol string that has undergone encoding, and an integer indicating the length of the longest match symbol string. The integer indicating the address of the longest match symbol string is a distance from the end of the symbol string within the specific range from the end of the symbol string that has undergone encoding to the longest match symbol string.

The information processing apparatus 2 includes a first decoding unit 2a and a second decoding unit 2b to decompress the compression file 4a.

The first decoding unit 2a retrieves a code string from the compression file 4a. The retrieved code string includes a code that results from encoding the intermediate code including the integer indicating the address and the integer indicating the length in a manner such that each integer having a higher occurrence frequency is encoded into a shorter code. The first decoding unit 2a decodes the code strings into an intermediate code string 2c, starting with the front of the retrieved code string. For example, using the Huffman tree, the first decoding unit 2a traces the Huffman tree from the root to the leaf in accordance with the value of the code, and encodes the intermediate code string 2c into an integer assigned to the leaf that the first decoding unit 2a has reached. The first decoding unit 2a may read information indicating the occurrence frequency of the integer from the recording medium 4, and may generate, in accordance with the read information, a Huffman tree similar to the Huffman tree used in encoding.

The second decoding unit 2b decodes the intermediate code including the integer indicating the address and the integer indicating the length included in the intermediate code string 2c. For example, the second decoding unit 2b identifies a symbol present at a distance corresponding to the integer indicating the address in the intermediate code as a decoding target from the end of the symbol string that has been obtained through decoding of intermediate codes in the intermediate code string 2c. From the identified symbol, the second decoding unit 2b then retrieves a symbol string of an integer indicating the length in the intermediate code as the decoding target. The second decoding unit 2b decodes the intermediate code as the decoding target into the retrieved symbol string. In this way, the intermediate code string 2c is decoded into the symbol string.

In the system, the first encoding unit is encodes the symbol string in the original file 3 into the intermediate code string 1c. For example, a symbol string " . . . caaad" is stored as an already encoded symbol string on the buffer 5, and is followed by a symbol string "aaabababab . . . " as an encoding target. It is assumed that each symbol in the symbol string is represented by 1 byte. In such a case, a symbol string "aaa" is detected as the longest match symbol string. The front of the longest match symbol string "aaa" in the buffer 5 is at a distance of 4 bytes from the end of the symbol string in the buffer 5. The length of the longest match symbol string "aaa" is 3 bytes. The front "aaa" of the symbol string "aaabababab . . . " as an encoding target is encoded into an intermediate code {3,4}. The right-hand side integer of the intermediate code indicates the length of the longest match symbol string and the left-hand side integer of the intermediate code indicates the address of the front of the longest match symbol string.

For each of the symbols of a specific number at the front of the original file 3, a binary notation representing the symbol directly becomes the intermediate code. If the longest match symbol string is not detected, or if the length of the longest match symbol string detected is shorter than a specific value, a binary notation of a leading symbol of the symbol strings that have not undergone encoding directly becomes an intermediate code.

The intermediate code string is generated by the first encoding unit is transferred to the second encoding unit 1b. The second encoding unit 1b determines the occurrence frequencies of the integers indicating the address and the length of the longest match symbol string. If the symbol string of the original file 3 is a set of a plurality of records, and the records are sorted according to any item value, records having the symbol strings sorted according the same item may be arranged close to each other. In such a case, the address of the longest match symbol string has a small value. The occurrence frequency of the integer, if calculated, indicates characteristics that the closer to zero the value of the integer is, the higher the occurrence frequency is. More specifically, the values of the integers are localized in the vicinity of 0.

The second encoding unit 1b performs an encoding operation so that an integer having a higher occurrence frequency is encoded into a shorter code. For example, if the occurrence frequency of the integer "1" is "0.137," the integer "1" is encoded into a 3-bit code "000." If the occurrence frequency of the integer "2" is "0.074," the integer "2" is encoded into a 4-bit code "0010." As the value of the integer is close to 0, the number of symbol strings encoded into short codes increases. As a result, the generated symbol string becomes short. In other words, a compression rate increases.

The symbol string thus generated through compression is stored as a compression file 4a on the recording medium 4. If the recording medium 4 is a mobile optical disk, the mobile optical disk may be inserted into the information processing apparatus 2, and the information processing apparatus 2 may read the compression file 4a. The compression file 4a may be transmitted from the information processing apparatus 1 to the information processing apparatus 2 via a network.

The first decoding unit 2a in the information processing apparatus 2 decodes a code string in the compression file 4a into an intermediate code. The intermediate code includes the integer indicating the address and the inter indicating the length. The intermediate code string 2c including a plurality of intermediate codes is transferred to the second decoding unit 2b. The second decoding unit 2b decodes the intermediate code into a symbol string, starting with the front of the intermediate code string 2c. For example, intermediate codes of a specific number in the front of the intermediate code string 2c are binary notifications of symbols, and thus directly become decoded symbols. If there is an intermediate code including an integer indicating the address and an inter indicating the length, the symbol at the distance corresponding to the integer indicating the address is identified from the end of the symbol string that has undergone decoding. The symbol string of the length corresponding to the integer indicating the length is retrieved from the identified symbol. The intermediate code is then decoded into the retrieved symbol string. When the intermediate code in the intermediate code string 2c is decoded, the symbol string identical to the symbol string in the original file 3 thus results.

The address in the sliding dictionary method is represented by the distance from the end of the symbol string that has undergone encoding. The integer representing the address is thus localized as an integer in the vicinity of zero. More specifically, the localization of the occurrence frequency of the integers increases. The compression rate is increased by encoding the integer in a manner such that each integer having a higher occurrence frequency is encoded into a shorter code. The compression rate increases.

The first encoding unit 1a, and the second encoding unit 1b are implemented by a processor in the information processing apparatus 1. The first decoding unit 2a, and the second decoding unit 2b are implemented by a processor in the information processing apparatus 2. The processor may be a central processing unit (CPU). The recording medium 4 may be implemented by a mobile recording medium, such as an optical disk, or a random-access memory (RAM), or a hard disk drive (HDD).

Each line connecting elements illustrated in FIG. 1 denotes part of a communication path, and a communication path other than the illustrated communication paths may also be used.

A second embodiment is described below. The second embodiment includes a variety of techniques to localize in the vicinity of 0 the integers representing the addresses of the longest match character strings. In the discussion that follows, a compression target is a character string. The character string as the compression target may include a symbol.

Figure 2:
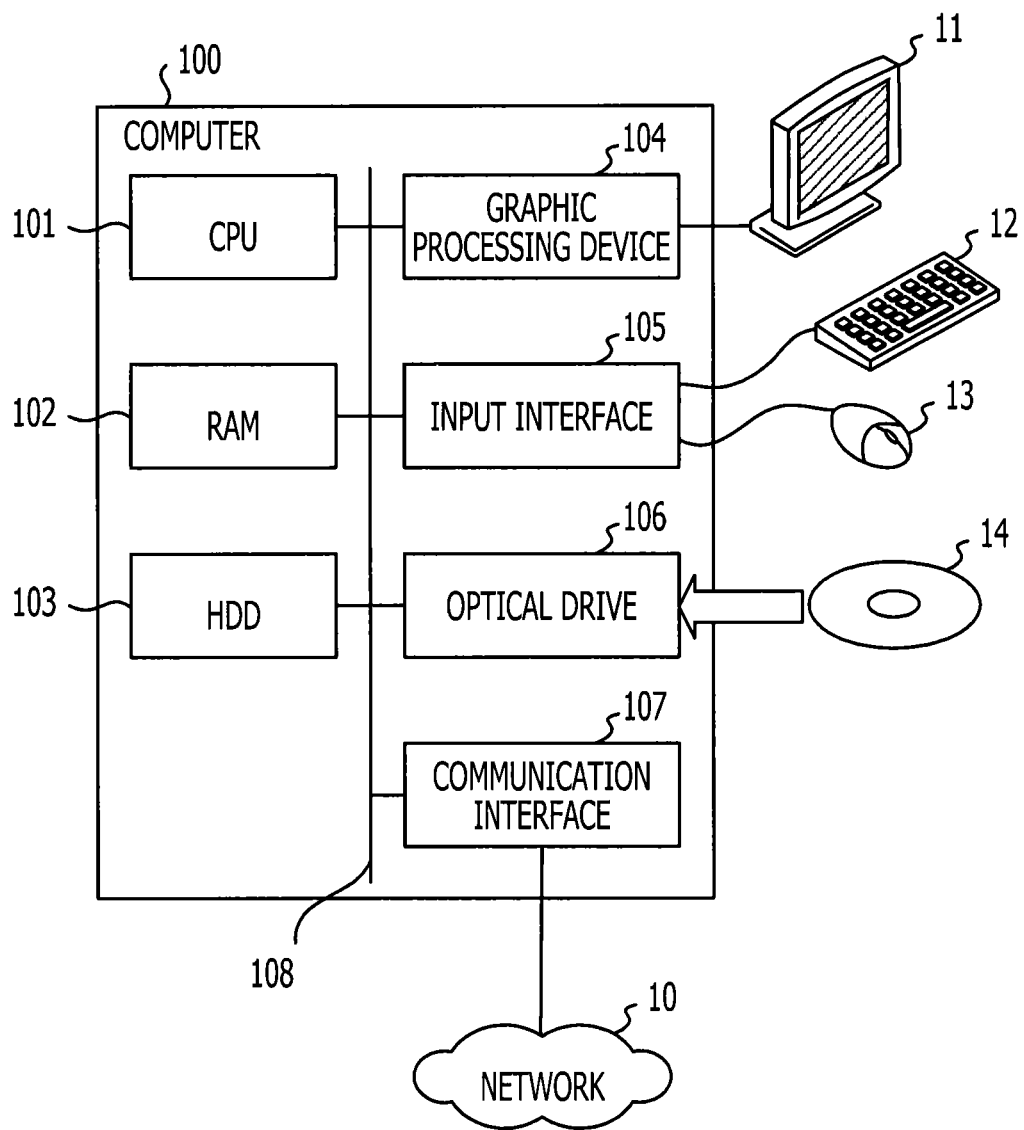
FIG. 2 illustrates a hardware configuration of a computer of a second embodiment.

FIG. 2 illustrates a hardware configuration of a computer 100 of the second embodiment. A CPU 101 in the computer 100 generally controls the computer 100. The CPU 101 connects to RAM 102 and a plurality of peripheral devices via a bus 108. The computer 100 includes one or a plurality of CPUs. If the computer 100 includes a plurality of CPUs, the plurality of CPUs operates in concert, and generally controls the computer 100. The CPU 101 is an example of processor. The CPU 101 may be a processor which executes a program described in the embodiment. The processor may be a graphics processing unit (GPU), a floating-point number processing unit (FPU), or a digital signal processor (DSP).

RAM 102 is used as a main memory of the computer 100. The RAM 102 temporarily stores a program of operating system (OS) executed by the CPU 101, and at least part of an application program. The RAM 102 stores a variety of data used in the process of the CPU 101.

The peripheral devices connected to the bus 108 includes HDD 103, graphic processing apparatus 104, input interface 105, optical drive 106, and communication unit 107.

The HDD 103 magnetically writes data to or reads data from a disk therein. The HDD 103 is used as a secondary storage device of the computer 100. The HDD 103 stores the program of the OS, the application program, and a variety of data. A semiconductor memory device such as a flash memory is used for the secondary storage device.

The graphic processing apparatus 104 connects to a monitor 11. The graphic processing apparatus 104 displays an image on the screen of the monitor 11 in response to an instruction from the CPU 101. A cathode ray tube (CRT) device or a liquid-crystal display may be used for the monitor 11.

The input interface 105 connects to a keyboard 12 and a mouse 13. The input interface 105 transfers a signal from the keyboard 12 or the mouse 13 to the CPU 101. The mouse 13 is an example of a pointing device. Another pointing device may be used. The other pointing devices include a touchpanel, a tablet, a touchpad, and a trackball.

The optical drive 106 reads data recorded on an optical disk 14 through a laser beam. The optical disk 14 is a mobile recording medium having data that are recorded thereon in a manner such that the data are read by means of optical reflection. The optical disk 14 may be one of digital versatile disc (DVD), DVD-RAM, CD-ROM (compact disc read only memory), CD-R (readable), and CD-RW (Rewritable).

The communication unit 107 is connected to the network 10. The communication unit 107 exchanges data with another computer or a communication apparatus via the network 10.

With the hardware configuration described above, the process and function of the second embodiment are implemented. The apparatuses of the first embodiment are also implemented by the same hardware as the computer of FIG. 2.

Figure 3:
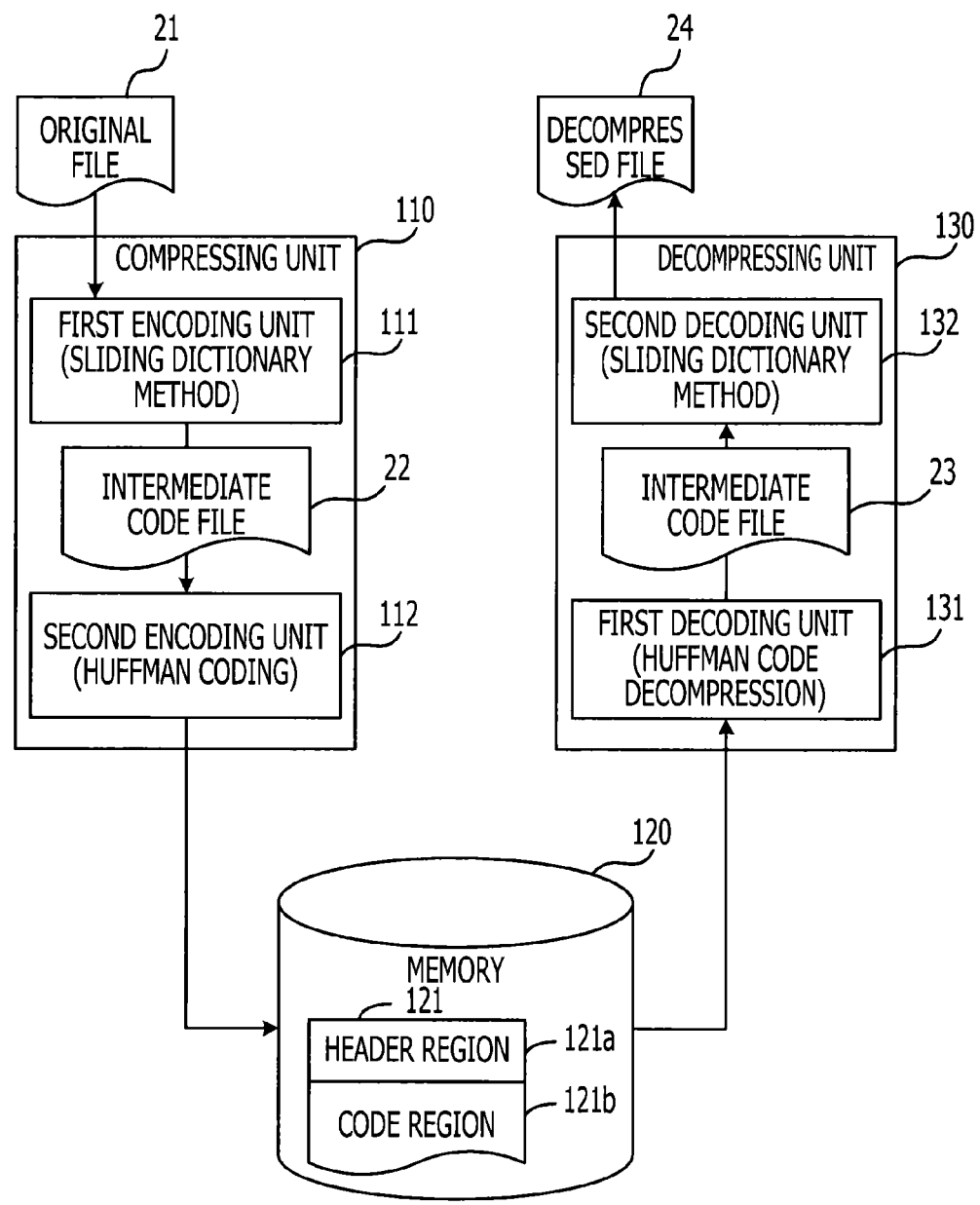
FIG. 3 is a block diagram illustrating compression and decompression functions of the computer of the second embodiment.

FIG. 3 is a block diagram of compression and decompression functions of the computer of the second embodiment. The computer 100 includes compressing unit 110, memory 120, and decompressing unit 130.

The compressing unit 110 compresses data of a character string described in the original file 21. The compressing unit 110 includes a first encoding unit 111 and a second encoding unit 112 to compress the data in the original file 21 at a high compression rate.

The first encoding unit 111 encodes the character string in the original file 21 through the sliding dictionary method. A code generated by the first encoding unit 111 is written on the intermediate code file 22. The intermediate code file 22 is temporarily stored on the RAM 102, for example.

The second encoding unit 112 encodes, into a Huffman code, specific information included in the intermediate code file 22. The second encoding unit 112 writes the generated code on a compression file 121. The second encoding unit 112 stores the compression file 121 on the memory 120.

The memory 120 stores the compression file 121. The compression file 121 includes a header region 121a and a code region 121b. Written on the header region 121a is a specifying method (modification method) of the address in the encoding through the sliding dictionary method, and a relative frequency of the integer as an encoding target used in the Huffman coding. A code resulting from compressing a character string in the original file 21 is written on the code region 121b.

The decompressing unit 130 decompresses a code written on the code region 121b of the compression file 121, and outputs the decompression file 24 having the same content as that of the original file 21. To decompress the code, the decompressing unit 130 includes a first decoding unit 131 and a second encoding unit 132.

The first decoding unit 131 decompresses a Huffman code. For example, the first decoding unit 131 decodes the Huffman code using information of the relative frequency of the integer indicated on the header region 121a. The first decoding unit 131 writes a value (intermediate code) resulting from decompression on the intermediate code file 23. The intermediate code file 23 is then stored on the RAM 102 temporarily.

The second decoding unit 132 decodes the intermediate code stored on the intermediate code file 23 through the sliding dictionary method. The second decoding unit 132 decodes the intermediate code using information of the modification method stored on the header region 121a. The second decoding unit 132 then writes a value as a result of decompression (plain text) on the decompression file 24. The decompression file 24 is temporarily stored on the RAM 102, for example.

The compressing unit 110 and the decompressing unit 130 are implemented by the CPU 101 in the computer 100 that executes the program stored on the RAM 102. The memory 120 may be part of the HDD 103 or the optical disk 14.

Each line connecting elements illustrated in FIG. 3 denotes part of a communication path, and a communication path other than the illustrated communication paths may also be used.

The computer 100 having the function illustrated in FIG. 3 compresses the data of the character string in the original file 21, thereby generating the compression file 121. The compression file 121 is stored on the memory 120. The computer 100 decompresses the code in the compression file 121, thereby generating the decompression file 24. The compression process and the decompression process are described in detail below.

The compression process of the character string in the original file 21 is described first. The character string in the original file 21 is a layout of a plurality of records. It is assumed that the records in the original file 21 are sorted according to a specific criterion.

FIG. 4 illustrates an example of the character string in the original file 21. The original file 21 in FIG. 4 includes a list of names structured by tag. The list of names includes information of the name, and address of each person. Information regarding one person forms a single record, for example.

The first encoding unit 111 encodes such a character string through the sliding dictionary method used in ZIP. The sliding dictionary method is a data compression method. Through the sliding dictionary method, the character string is compressed using a buffer region called the sliding window.

Figure 5:
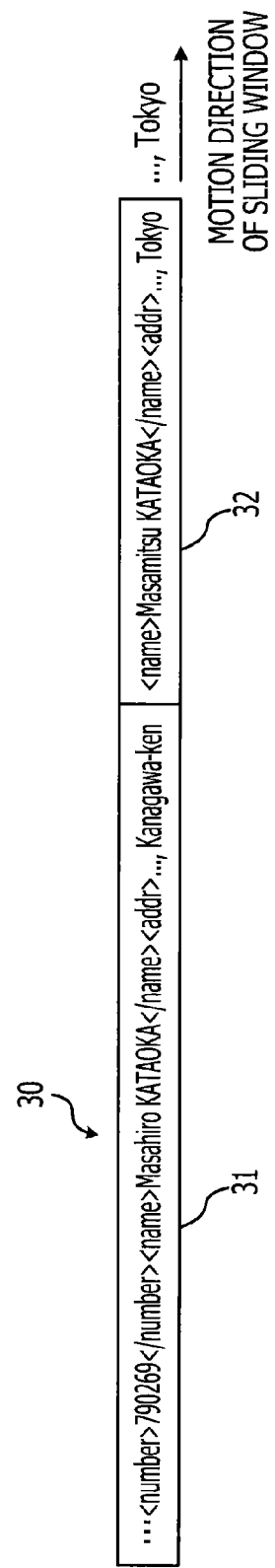
FIG. 5 illustrates a sliding dictionary method.

FIG. 5 illustrates the sliding dictionary method. The character string enters as a compression target the right side of a sliding window 30 used in the sliding dictionary method in FIG. 5, and then successively shifts leftward. When the sliding window 30 is full of the character string, the character at the left end of the sliding window 30 is successively discarded. The entering operation of the character string into the sliding window 30 is also referred to as a sliding operation of the sliding window 30 over the character strings. Character strings enclosed in the sliding window 30 out of the character strings as a compression target are stored on the sliding window 30 serving as a buffer. The sliding window 30 shifts from the front of the character string serving as the compression target to the character string at the end. In the example of FIG. 5, the sliding window 30 shifts rightward.

The region of the sliding window 30 is divided into a reference region 31 and an encoding region 32. The character string stored in the reference region 31 serves a dictionary for encoding the character string stored in the encoding region 32. More specifically, the character strings successively become a compression target in the order starting with the leading character string. A character string becoming a compression target is encoded with a character string within an immediately preceding specific range used as a dictionary.

Figure 6:
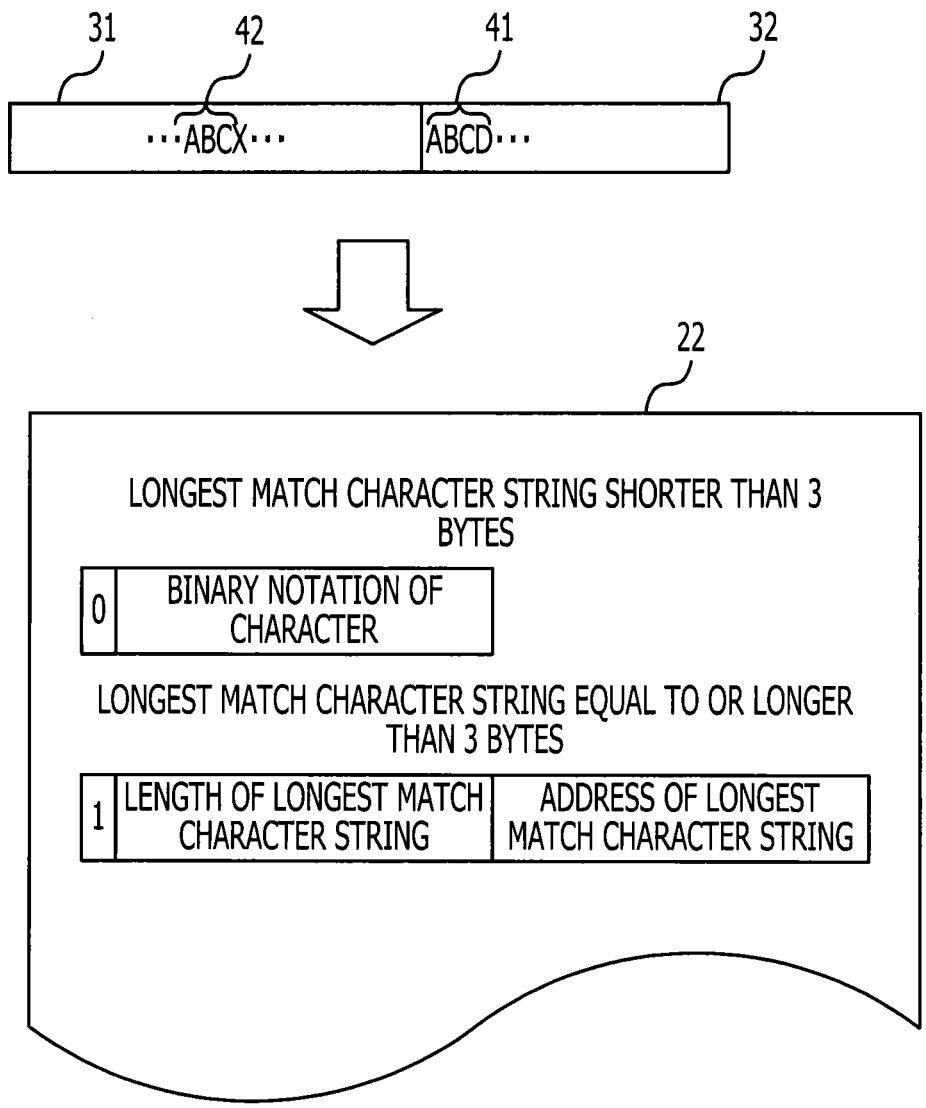
FIG. 6 illustrates an example of encoding through the sliding dictionary method.

FIG. 6 illustrates an example of encoding through the sliding dictionary method. The first encoding unit 111 searches the reference region 31 for a character string that has the longest match pattern with a character string in the front of the encoding region 32 of the sliding window 30. A match character string is referred to as the longest match character strings 41 and 42. The longest match character strings 41 and 42 are also referred to as the longest match subsequences.

As illustrated in FIG. 6, a character string matching three characters "ABC" in the front of the encoding region 32 is detected from the reference region 31. A fourth character of the encoding region 32 is "D" while the character following "ABC" in the reference region 31 is "X." The character string of three characters match each other, but the fourth characters are different. In such a case, the character string "ABC" becomes the longest match character strings 41 and 42.

The first encoding unit 111 encodes the longest match character string 41 in the encoding region 32. If the length of the longest match character string 41 is shorter than 3 bytes, the first encoding unit 111 outputs the character string in binary notation to the intermediate code file 22 without encoding the longest match character string. In this case, the first encoding unit 111 attaches a flag "0" indicating an unencoded status to the front of the character.

If the length of the longest match character string 41 is equal to or longer than 3 bytes, the first encoding unit 111 outputs the length and address of the longest match character string 42 in the reference region 31 to the intermediate code file 22. In this case, the first encoding unit 111 attaches a flag "1" indicating an encoded status to the front of the character. The length of the longest match character string is a data length of the longest match character string 42, and is represented by the number of bytes (integer). If the longest match character string 42 is 3 characters with one character being one byte as illustrated in FIG. 6, the length of the longest match character string is "3."

The address of the longest match character string is information indicating a location of the longest match character string in the reference region 31. For example, the location of the leading character of the longest match character string 42 in the reference region 31 is set to be the address of the longest match character string. A character string present in a range corresponding to the data length represented by the length of the longest match character string extending from the address of the longest match character string is the longest match character string 42.

The address of the longest match character string is encoded into a Huffman code by the second encoding unit 112. When the address of the longest match character string is encoded into a Huffman code, the compression efficiency is higher as the integers indicating the addresses are localized more. In other words, data having a higher occurrence frequency are encoded into a shorter code in the Huffman coding process. As the localization in the occurrence frequency of the integers indicating the addresses is larger, a percentage of codes that are encoded into shorter codes becomes higher. A higher compression rate thus results.

Described below is how the degree of localization of the integers indicating the addresses is different depending on the address modification method of the longest match character string.

An address modification method in LZ77 compression algorithm of related art, such as ZIP, is described below as a comparative example. The LZ77 compression algorithm of related art specifies an address of the longest match character string by an offset from the front of the sliding window 30.

FIGS. 7A and 7B illustrate the address modification of the longest match character string performed in accordance with the offset from the front of the sliding window. FIG. 7A illustrates the encoding region 32 having a personal name in the front thereof, and FIG. 7B illustrates the encoding region 32 having a geographical name in the front thereof.

If the character string of the encoding region 32 is a tagged personal name "<name>Masamitsu KATAOKA</name>," the longest match character string is searched for in the reference region 31 according to the character string. In this case, "<name>Masa . . . KATAOKA" is the longest match character string 43 of the encoding region 32. The same character string in the reference region 31 becomes the longest match character string 44 in the reference region 31. An offset γa from the front of the reference region 31 to the leading character of the longest match character string 44 becomes the address of the longest match character string 44.

The data length of each record may be different from the above-described case. In such a case, even if the leading character string in the reference region 31 is the same as in FIG. 7A, the front of the encoding region 32 may become a geographic name. If the leading character string in the encoding region 32 is a tagged geographical name "<addr> . . . , Tama-ku, Kawasaki-shi, Kanagawa-ken," the longest match character string is searched for in the reference region 31 according to the character string. In this case, "<addr> Kanagawa-ken" in the encoding region 32 becomes the longest match character string 45 in the encoding region 32. The same character string in the reference region 31 becomes the longest match character string 46 of the reference region 31. An offset γb from the front of the reference region 31 to the leading character of the longest match character string 46 becomes an address of the longest match character string 46.

The distribution of the occurrence frequency of the integer indicating the address are affected by the offsets γa and γb.

FIG. 8 illustrates the distribution of the addresses when the address modification of the longest match character string is performed in accordance with the offset from the front of the sliding window. In FIG. 8, the abscissa represents the integer of the address of the longest match character string, and the ordinate represents the occurrence frequency of the integer. As illustrated in FIG. 8, if the address modification of the longest match character string is performed in accordance with the offset from the front of the sliding window, the name and the geographical name are affected by the offsets γa and γb. Even if the addresses are localized on each of the types of the character strings forming the records (for example, the personal name or the geographical name), the addresses are dispersed among the character strings of different types. As a result, the localization of the integers indicating the addresses does not increase as a whole.

The address of the longest match character string 42 may be set to be an offset from the end of the reference region 31 (the right end of the chart in FIG. 5) to the leading character in the longest match character string 42. Such a case is described below.

FIGS. 9A and 9B illustrate the address modification of the longest match character string performed in accordance with the offset from the end of the reference region 31. As illustrated in FIG. 9, the longest match character strings 44 and 46 in the reference region 31 are specified by the offset from the end of the reference region 31. FIG. 9A illustrates the encoding region 32 having a personal name in the front thereof, and FIG. 9B illustrates the encoding region 32 having a geographical name in the front thereof.

Such an address may now be used. In the character strings taking a regular pattern as in the list of FIG. 4, the integer indicating the address of the longest match character string and giving a high occurrence frequency tends to take periodicity with one period equal to a record length. For example, the address may be expressed by $\alpha n+\beta$ (or $\alpha n-\beta$). In this case, an represents a product of $\alpha$ and n.

Here, n represents a period with which the occurrence frequency of the integer indicating the address of the longest match character string becomes high. The period may be approximated to be a record length of each record. The period n is an integer equal to or larger than 1. If the record has a fixed length, the number of bytes of the fixed length becomes the period n. If the record has a variable length, a value resulting from rounding an average value of data lengths of the records to the nearest integer is the period n.

In the expression, $\alpha$ is a difference between an identification number (record number) of a record that the longest match character string 41 in the code region 121b belongs to and an identification number of a record that the longest match character string 42 in the reference region 31 belongs to. In the character strings of FIG. 4, a value enclosed between <number> tags is a record number of each record. In the expression, $\alpha$ is an integer equal to or larger than 1.

In the expression, $\beta$ is an error between an integer multiple of the period n and an address in the variable length. Here, $\beta$ is an integer equal to or larger than 0. If the record has a fixed length, the value of $\beta$ is "0."

The reason why the address is rationally represented by "$\alpha n \pm \beta$" is described below.

Figure 10:
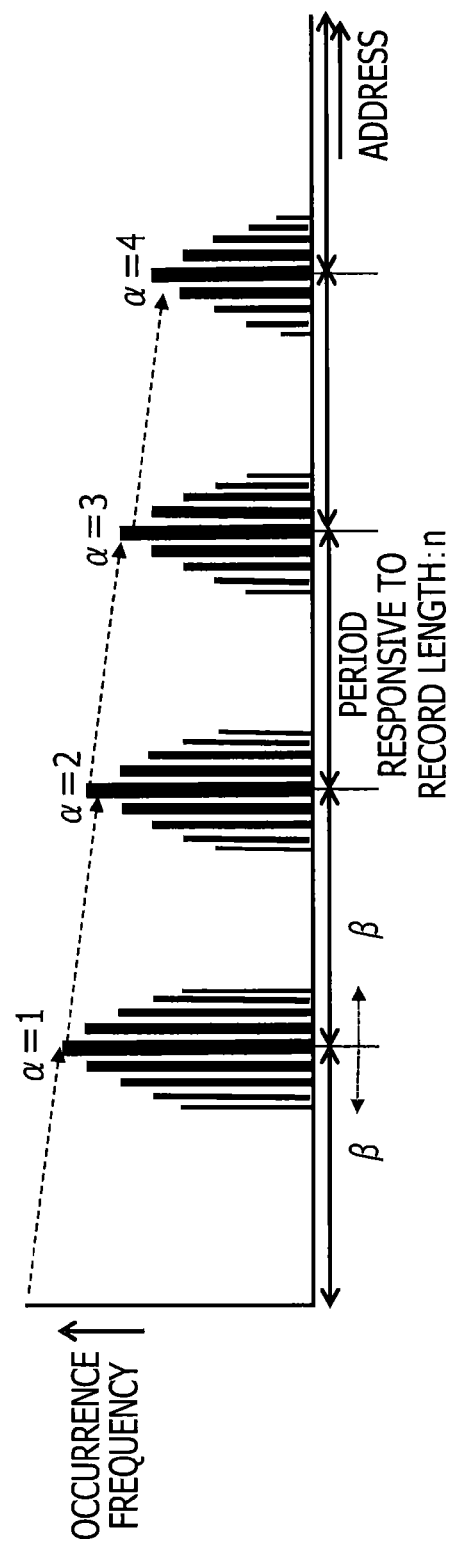
FIG. 10 illustrates a distribution example of addresses when the address modification is performed on the longest match character string with the offset from the end of the reference region.

FIG. 10 illustrates the distribution of addresses obtained when the address modification of the longest match character string is performed in accordance with the offset from the end of the reference region. In FIG. 10, the abscissa represents integers indicating the addresses of the longest match character strings and the ordinate represents the occurrence frequencies of the integers. As illustrated in FIG. 10, periodicity of the record length as one period is observed in the value of the integer indicating the address giving a high occurrence frequency. The integer indicating the address is localized in the vicinity of the position of the integer multiple of the record "an." The address of the longest match character string giving a high occurrence frequency has a periodicity of the period n as one cycle as the record length.

If the address has such a periodicity of the record length, the integer including $\alpha$ and $\beta$ is localized by representing the address by "$\alpha n \pm \beta$."

Figure 11:
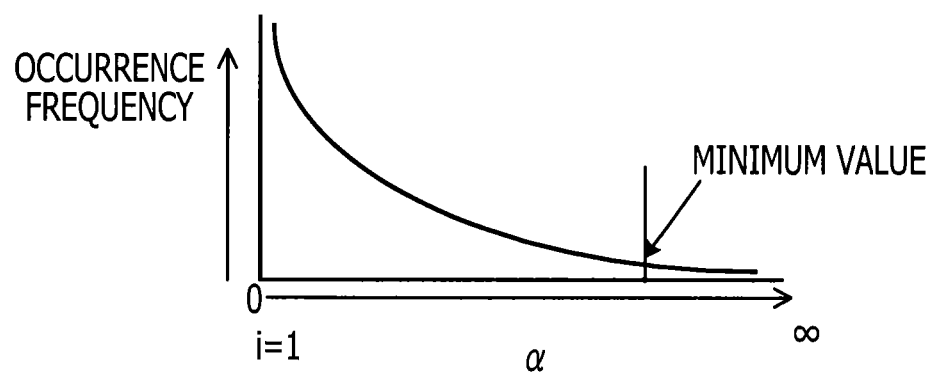
FIG. 11 illustrates characteristics of $\alpha$ in an address $(\alpha n \pm \beta)$.

FIG. 11 illustrates characteristics of a in the address $\alpha n \pm \beta$. In FIG. 11, the abscissa represents the value of a (integer), and the ordinate represents the occurrence frequency of the value of $\alpha$. As illustrated in FIG. 11, the higher the value of $\alpha$ is, the smaller the occurrence frequency of the integer is. In other words, the value $\alpha$ is localized in the vicinity of 0. The graph of FIG. 11 is plotted on the assumption that the size of the reference region 31 of the sliding window 30 is infinite ($\infty$). In practice, however, the size of the reference region 31 is finite. For this reason, the number of records storable on the reference region 31 of the sliding window 30 is a maximum value of $\alpha$, and the occurrence frequency at the maximum value of $\alpha$ is a minimum value of the occurrence frequency.

Figure 12:
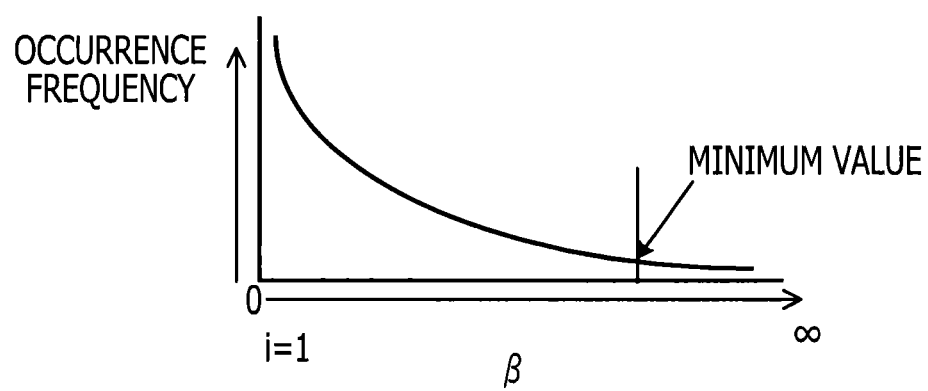
FIG. 12 illustrates characteristics of $\beta$ in the address $(\alpha n \pm \beta)$.

FIG. 12 illustrates characteristics of $\beta$ in the address $\alpha n \pm \beta$. In FIG. 12, the abscissa represents the value of $\beta$ (integer), and the ordinate represents the occurrence frequency of the value of $\beta$. As illustrated in FIG. 12, the larger the value of $\beta$ is, the lower the occurrence frequency of the integer. In other words, the value of $\beta$ is localized in the vicinity of 0. The graph of FIG. 12 is plotted on the assumption that the error between an integer multiple of the period n ($\alpha n$) responsive to the record length and the address may is infinite ($\infty$), but in practice, the error is half the period n at maximum. The maximum value of the error is the maximum value of $\beta$, and the occurrence frequency at the maximum value of $\beta$ is a minimum value of the occurrence frequency.

The periodicity of the address responsive to the record length illustrated in FIGS. 10 through 12 is pronounced when the character strings like the list illustrated in FIG. 4 are a compression target. More specifically, the character strings of the list of FIG. 4 have a periodicity of the record length in the appearance location of the value of each item in the record. For example, the character strings of the personal name and the geographical name registered in items of name, affiliation, address, and the like generally appear with the record length period.

If such character strings are encoded through the sliding dictionary method with the offset from the front of the sliding window 30 set to be an address, a character at a location serving as a reference of the offset (a leading character string in the reference region 31) is not related to the longest match character string (see FIG. 8). For this reason, the periodicity of the character occurrence frequency responsive to the record length is not accounted for in the address.

If the offset referenced from the end of the reference region 31 is set to be an address on the other hand, the offset is referenced from a leading character of the longest match character string in the encoding region 32. The longest match character string in the encoding region 32 and the longest match character string in the reference region 31 frequently happen to be character strings in the same item in a record including a plurality of items (such as a personal name and a geographical name). If the offset from the end of the reference region 31 is set to be the address, the occurrence period of the item in the record (record length) is accounted for in the address. According to the second embodiment, the offset from the end of the reference region 31 is set to be the address.

If a plurality of longest match character strings is detected in the reference region 31 in the second embodiment, the position of the longest match character string close to the end of the reference region 31 is set to be an address in encoding. The degree of localization of the value of a to the vicinity of 0 is thus increased.

When all the character strings in the original file 21 are encoded through the sliding dictionary method, the second encoding unit 112 performs the encoding operation to the Huffman code in accordance with the intermediate code file 22. For example, the second encoding unit 112 encodes the length of the longest match character string and the address of the longest match character string into Huffman codes. In this case, if the address of the longest match character string is represented in the format $\alpha n \pm \beta$, the second encoding unit 112 separately encodes $\alpha$ and $\beta$.

Figure 13:
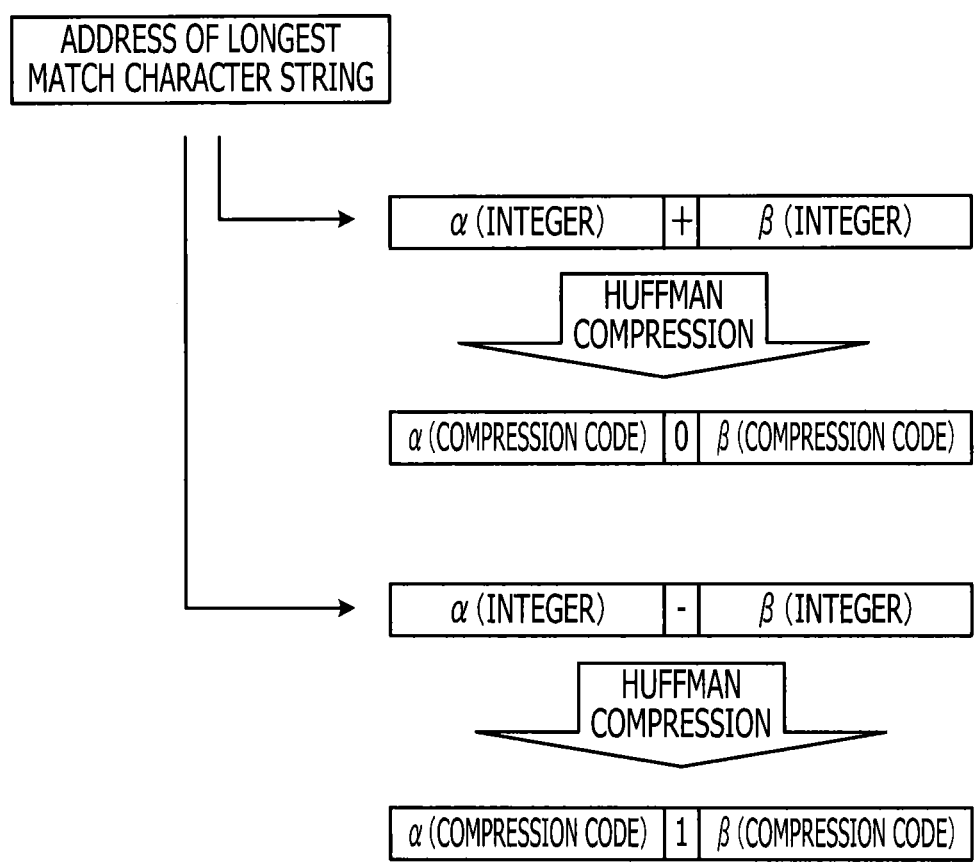
FIG. 13 illustrates a compression status of the longest match character string.

FIG. 13 illustrates a compression status of the longest match character string. The address of the longest match character string may be "$\alpha n+\beta$" or "$\alpha n-\beta$." In the address $\alpha n+\beta$, $\alpha$ and $\beta$ are separately encoded through Huffman coding. A sign "+" is converted into "0." In the address $\alpha n-\beta$, $\alpha$ and $\beta$ are separately encoded through Huffman coding. A sign "−" is converted into "1." In the Huffman coding of $\alpha$ and $\beta$, a common Huffman tree may be used. The Huffman tree is an example of a tree of codes used in encoding. A nodeless tree (FIG. 35) to be described in a fifth embodiment may also be used for the code tree.

As described with reference to FIGS. 11 and 12, the values of $\alpha$ and $\beta$ are localized in the vicinity of 0. For this reason, the compression rate may be increased by representing the address of the longest match character string in the format $\alpha n+\beta$ and by encoding $\alpha$ and $\beta$ separately into Huffman codes. With the address represented in the format $\alpha n+\beta$, the length of a compression code is shortened, leading to an even higher compression rate.

Figure 14:
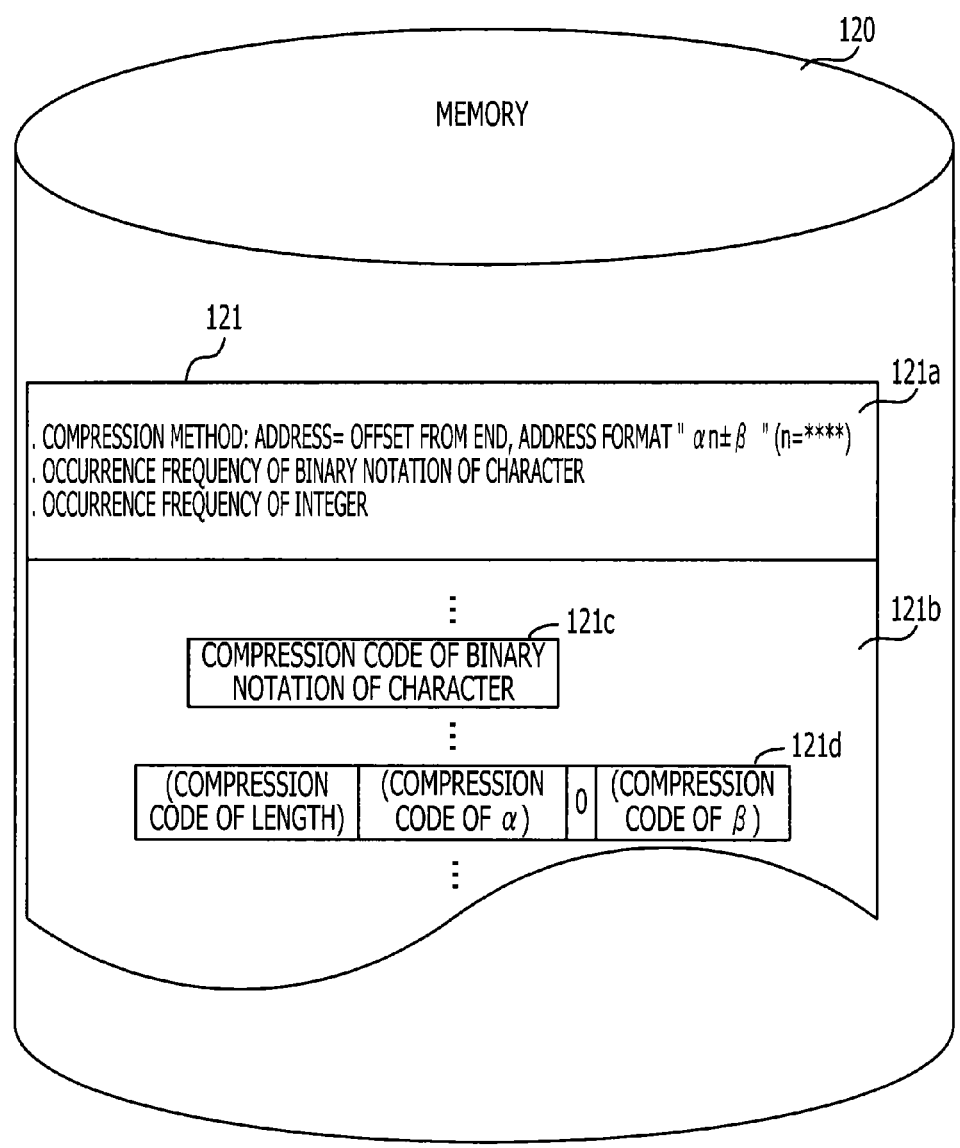
FIG. 14 illustrates an example of a compression file stored on a memory.

FIG. 14 illustrates an example of a compression file stored on the memory 120. The header region 121a of the compression file 121 stored on the memory 120 indicates that the address in the sliding dictionary method as a compression method is an offset from the end of the reference region 31. The header region 121a also indicates that the address format is $\alpha n \pm \beta$. The header region 121a also indicates the value of the period n responsive to the record length. The header region 121a further indicates the occurrence frequency of the binary notation of each character, and the occurrence frequency of the integer.

The code region 121b stores a compression code 121c of the binary notation of the character, and a compression code 121d of the length and address. The compression codes of the address include a compression code of $\alpha$, a flag indicating positive or negative, and a compression code of $\beta$, for example.

The compression file 121 may be stored on a mobile recording medium such as the optical disk 14. In such a case, another computer having the same function as in FIG. 3 may read the compression file 121 on the mobile recording medium and to decompress the compression file 121 into the original file 21.

A procedure of the compression process incorporating the technique described above is described below.

Figure 15:
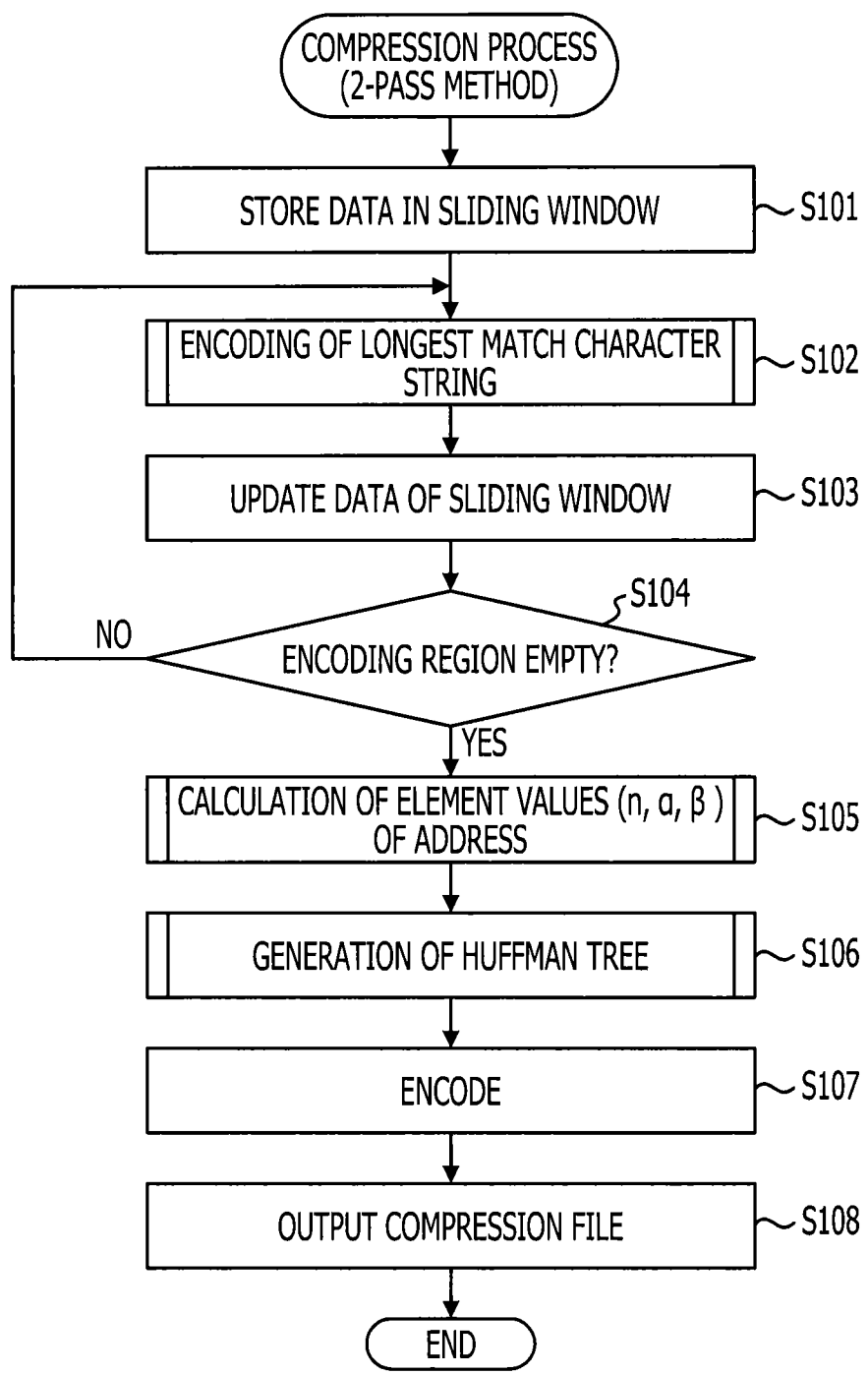
FIG. 15 is a flowchart illustrating a procedure example of a compression process.

FIG. 15 is a flowchart illustrating a procedure example of the compression process. The compression process of FIG. 15 is described with reference to step numbers. The compression process of FIG. 15 is a 2-pass method in which all character strings in the original file 21 are encoded through the sliding dictionary method and the resulting codes are encoded into Huffman codes. A compression method other than the 2-pass method is described below (third embodiment).

S101 The first encoding unit 111 reads the character strings in the original file 21 in the order from the front thereof, and then stores the read character string in the sliding window 30. For example, the first encoding unit 111 stores the character string in the encoding region 32 of the sliding window 30.

S102 Using the character string stored in the reference region 31 of the sliding window 30 as a dictionary, the first encoding unit 111 encodes the longest match character string in the encoding region 32. This operation is described in detail below (see FIG. 16).

S103 The first encoding unit 111 updates the data in the sliding window 30. For example, if the reference region 31 includes an empty area corresponding to the encoded character string, the first encoding unit 111 writes an encoded character string in succession to the end of the character strings in the reference region 31. If the reference region 31 includes no empty area corresponding to an encoded character string, the first encoding unit 111 deletes the character strings, starting with the leading character string in the reference region 31 to arrange an empty area corresponding to an encoded character string, and shifts the character strings forward. The first encoding unit 111 writes an encoded character string in succession to the end of the character strings in the reference region 31.

The first encoding unit 111 also deletes the encoded character string from the encoding region 32, and shifts the character strings forward in the encoding region 32. If an unencoded character string is present in the original file 21, the first encoding unit 111 reads the unencoded character strings, starting with the leading one, and stores the read character string in an empty area in the encoding region 32 of the sliding window 30.

S104 The first encoding unit 111 determines whether the encoding region 32 of the sliding window 30 is empty. If the encoding region 32 of the sliding window 30 is empty, the first encoding unit 111 proceeds to step S105. If an unprocessed character string remains in the encoding region 32 of the sliding window 30, the first encoding unit 111 returns to step S102.

S105 The second encoding unit 112 calculates element values $(n,\alpha,\beta)$ of the address of the longest match character string. This operation is described in detail below (see FIG. 17).

S106 The second encoding unit 112 generates a Huffman tree.

S107 The second encoding unit 112 encodes a code string (address, length, and binary notation of character) in the intermediate code file 22 into a Huffman code. As illustrated in FIG. 13, if the address is described in the format $\alpha n+\beta$, the second encoding unit 112 encodes $\alpha$ and $\beta$ separately. The second encoding unit 112 encodes $\alpha$, $\beta$, and the binary notation of the character using separate Huffman trees. If the occurrence frequencies of $\alpha$ and $\beta$ are similar to each other, the encoding thereof is performed using a common Huffman tree.

S108 The second encoding unit 112 outputs the compression file 121. For example, the second encoding unit 112 writes the code generated in step S106 on the code region 121b. The second encoding unit 112 also writes, on the header region 121a of the compression file 121, information indicating the method of the address modification, and the occurrence frequency of the integers of the address and the length. The information of the method of the address modification may indicate that the address is the offset from the end of the reference region 31 to the front of the longest match character string, and that α and β of the address in the format αn+β are separately encoded. The information of the method of the address modification may also indicate the value of n (record length). The header region 121a also includes information that indicates whether α, β, and the binary notation of the character are encoded using separate Huffman trees, or whether α and β are encoded using a common Huffman tree. The second encoding unit 112 stores the generated compression file 121 on the memory 120.

The character strings in the original file 21 are thus compressed, and the compression file 121 results.

An encoding process of the longest match character string (step S102) is described in detail.

Figure 16:
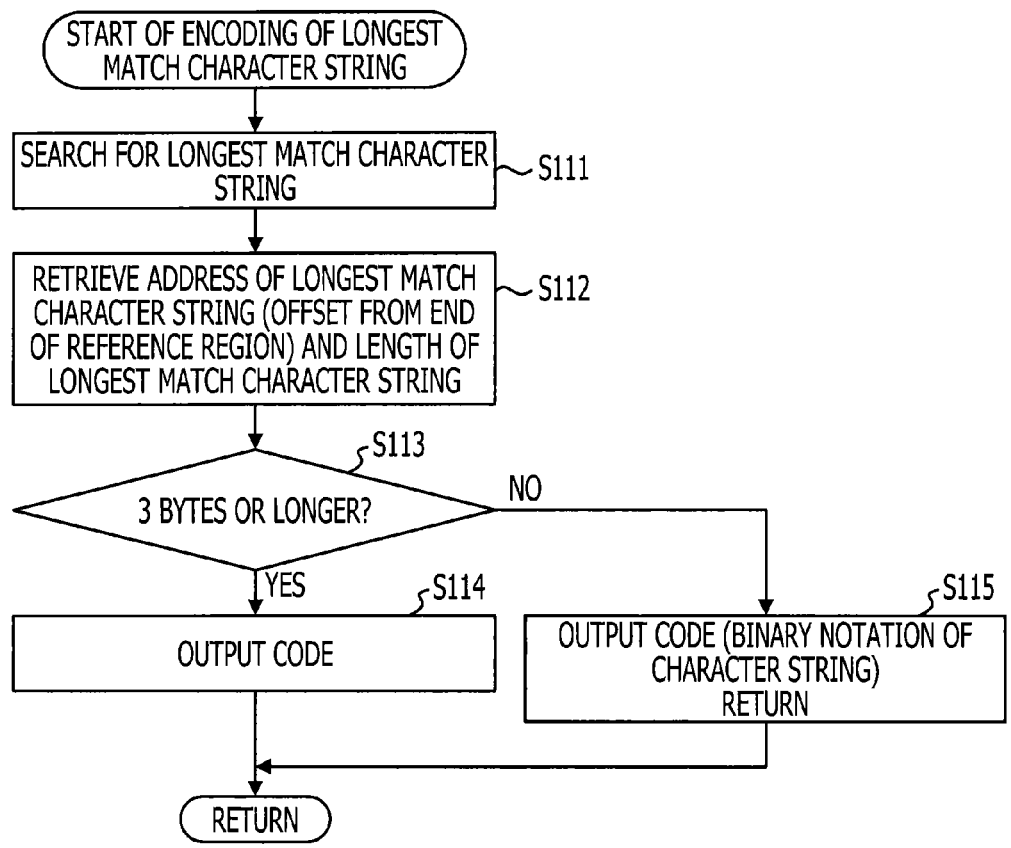
FIG. 16 is a flowchart illustrating a procedure example of an encoding process of the longest match character string.

FIG. 16 is a flowchart illustrating a procedure example of the encoding process of the longest match character string. The process of FIG. 16 is described with reference to step numbers.

S111 The first encoding unit 111 searches the reference region 31 for the longest match character string corresponding to a leading character string in the encoding region 32 of the sliding window 30. If a plurality of longest match character strings is detected, the first encoding unit 111 retrieves the longest match character string close to the end of the reference region 31 as a search result.

S112 The first encoding unit 111 retrieves the address and the length of the longest match character string obtained as the search result. The address of the longest match character string is the offset (byte number) from the end of the reference region 31 to the front of the longest match character string. The length is the byte number of the longest match character string.

S113 The first encoding unit 111 determines whether the address of the longest match character string is 3 bytes or longer. If the address of the longest match character string is 3 bytes or longer, the first encoding unit 111 proceeds to step S114. If the address of the longest match character string is shorter than 3 bytes, the first encoding unit 111 proceeds to step S115.

S114 The first encoding unit 111 outputs, to the intermediate code file 22, a code indicating the address and the length. For example, the first encoding unit 111 outputs the address in the data format illustrated in FIG. 6. The encoding process of the longest match character string is complete.

S115 If the length of the longest match character string is shorter than 3 bytes, the first encoding unit 111 outputs the binary notation of the longest match character string as a code to the intermediate code file 22. The encoding process of the longest match character string is complete.

The longest match character string is thus encoded. The encoding process is performed on all the character strings in the original file 21.

A calculation process of the address element value (step S105) is described in detail below.

Figure 17:
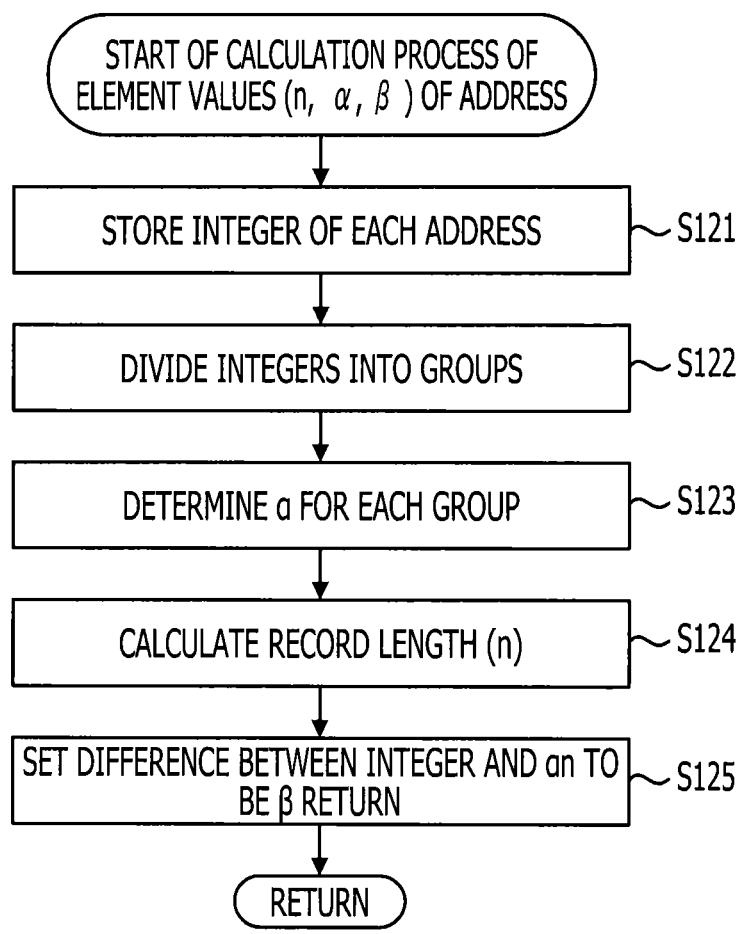
FIG. 17 is a flowchart illustrating a procedure example of a calculation process of an address element value.

FIG. 17 is a flowchart illustrating a procedure example of a calculation process of the address element value. The calculation process of FIG. 17 is described with reference to step numbers.

S121 The second encoding unit 112 stores the integer of each address on the RAM 102.

S122 The second encoding unit 112 divides the recorded integers into groups. For example, as illustrated in FIG. 10, the second encoding unit 112 determines the integer indicating the address and the occurrence frequency of the integer. Consecutive integers having an occurrence frequency of 1 or higher are set to be in one group. If the consecutive integers having an occurrence frequency of 1 or higher repeat an increase and decrease cycle in the occurrence frequency. In such a case, a given integer may serve as a border where the occurrence frequency transitions from a decrease phase to an increase phase. The integers above and below the border are divided into different groups. The integers having the occurrence frequencies of FIG. 10 are divided into a plurality of groups, including a group of integers in the vicinity of an with "α=1," a group of integers in the vicinity of an with "α=2" . . . ., for example.

S123 The second encoding unit 112 determines a for each group. For example, the second encoding unit 112 determines an average value of the integers belonging to each group. The second encoding unit 112 arranges the average values in the order from small to large values. The second encoding unit 112 assigns integers as a to the groups, starting assigning 1 to the group having the smallest average value. The value of a assigned to each group serves as a value of a of the integer belonging to the group.

S124 The second encoding unit 112 examines the periodicity of the integers increasing in occurrence frequency in accordance with the grouped integers, and thus determines the period n responsive to the record length. For example, the second encoding unit 112 arranges the plurality of groups in the order of from large to small values of assigned α. The second encoding unit 112 calculates the average value of the integers in each group. The second encoding unit 112 determines a difference between the average values of adjacent groups, and sets the difference as an inter-group distance. The second encoding unit 112 then sets the average value of the inter-group distances as the period n.

The second encoding unit 112 may determine an integer giving a maximum occurrence frequency within the group in place of the average value of the integers within the group. In such a case, the second encoding unit 112 sets a difference of the integers giving maximum occurrence frequencies between the adjacent groups to be the inter-group distance.

S125 The second encoding unit 112 determines the value of β for each integer. The second encoding unit 112 calculates "αn" in accordance with the value of a assigned to the group of integers indicating addresses and the period n determined in step S124. A difference between the integer indicating the address and "αn" is β. If the integer indicating the address is equal to or larger than "αn," the sign of β is "+." If the integer indicating the address is smaller than "αn," the sign of β is "−."

The address of the longest match character string is thus represented in the format "αn±β."

A generation process of the Huffman tree (step S106) is described below.

Figure 18:
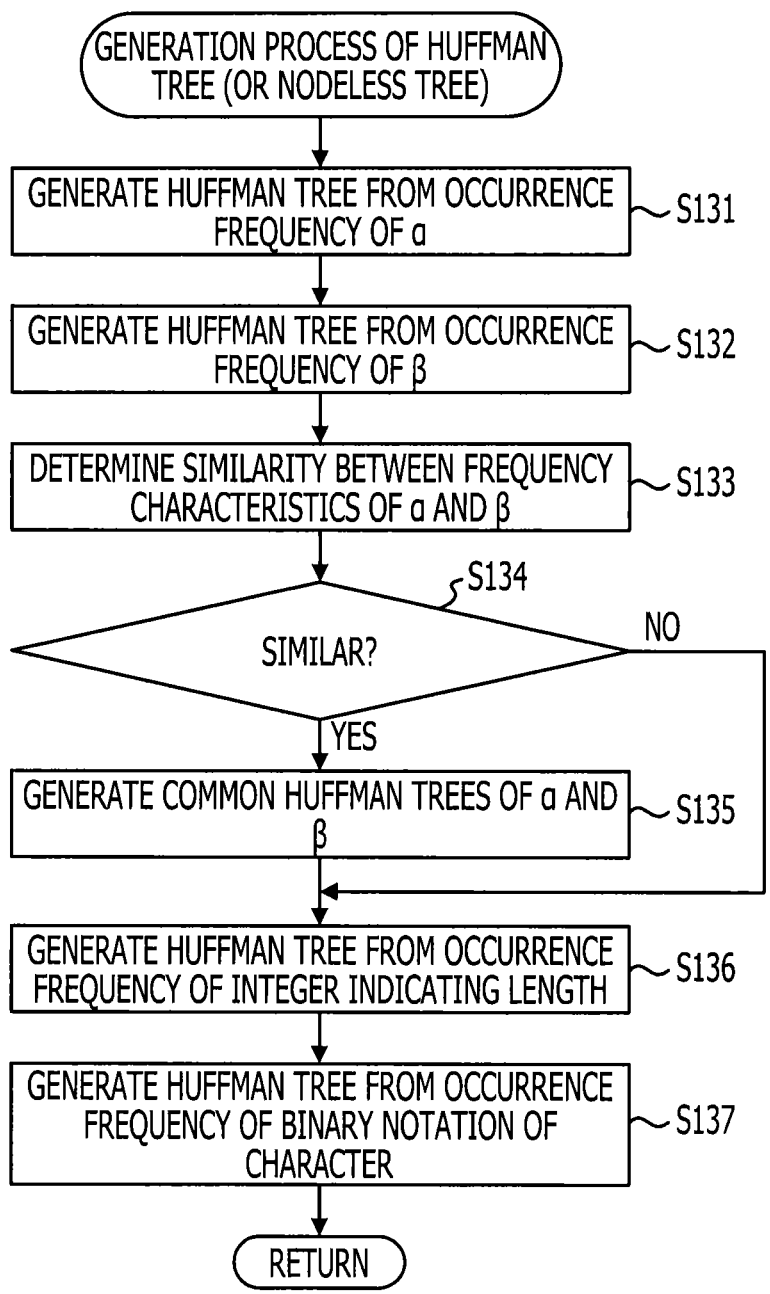
FIG. 18 is a flowchart illustrating a procedure example of a generation process of the Huffman tree.

FIG. 18 is a flowchart illustrating a procedure example of the Huffman tree generation process. The Huffman tree generation process of FIG. 18 is described with reference to step numbers.

S131 The second encoding unit 112 determines the occurrence frequency of the integer indicating a. The occurrence frequency of the integer indicating α is a count of occurrences of the integer to the total count of occurrences of a of all addresses. The second encoding unit 112 generates the Huffman tree in accordance with the occurrence frequency of the integer indicating α.

S132 The second encoding unit 112 determines the occurrence frequency of the integer indicating β. The occurrence frequency of the integer indicating β is a count of occurrences of the integer to the total count of occurrences of β of all addresses. The second encoding unit 112 generates the Huffman tree in accordance with the occurrence frequency of the integer indicating β.

S133 The second encoding unit 112 determines a similarity between the frequency characteristics of β and β. For example, the second encoding unit 112 calculates a difference of the occurrence frequency of α and the occurrence frequency of β on the value of each integer. The second encoding unit 112 sums the differences resulting from the values of the integers. If the sum is equal to or smaller than a specific value, the second encoding unit 112 determines the frequency characteristics of α and β are similar.

S134 If the frequency characteristics of α and β are similar, the second encoding unit 112 proceeds to step S135. If the frequency characteristics of α and β are not similar, the second encoding unit 112 proceeds to step S136.

S135 The second encoding unit 112 generates a Huffman tree common to α and β. For example, the second encoding unit 112 determines the occurrence frequency of the integer indicating α or β. The occurrence frequency of the integer is a count of occurrences of the integer to the sum of the total count of occurrences of α and the total count of occurrences of β of all addresses. The second encoding unit 112 generates a Huffman tree in accordance with the occurrence frequency of α or β.

S136 The second encoding unit 112 determines an occurrence frequency of the integer indicating the length. The occurrence frequency of the integer indicating the length is a count of occurrences of the integer to the total count of occurrences of the integers indicating all the lengths. The second encoding unit 112 generates a Huffman tree in accordance with the occurrence frequency of the integer indicating the length.

S137 The second encoding unit 112 determines the occurrence frequency of the binary notation of the character. The occurrence frequency of the binary notation of the character is a count of occurrences of the binary notation of the character to the total count of occurrences of the binary notation of the characters. The second encoding unit 112 generates a Huffman tree in accordance with the occurrence frequency of the binary notation of the character.

The Huffman trees are generated to be used as a compression dictionary. Using the generated Huffman tree, the integers of the address and the length generated through the sliding dictionary method and the binary notation of the character are encoded into Huffman codes. If the occurrence frequency characteristics of α and β are similar, a common Huffman tree may be used. The use of the common Huffman tree may reduce resources used in the compression and decompression, such as memories.

A decompression process of the code included in the compression file 121 is described below.

Figure 19:
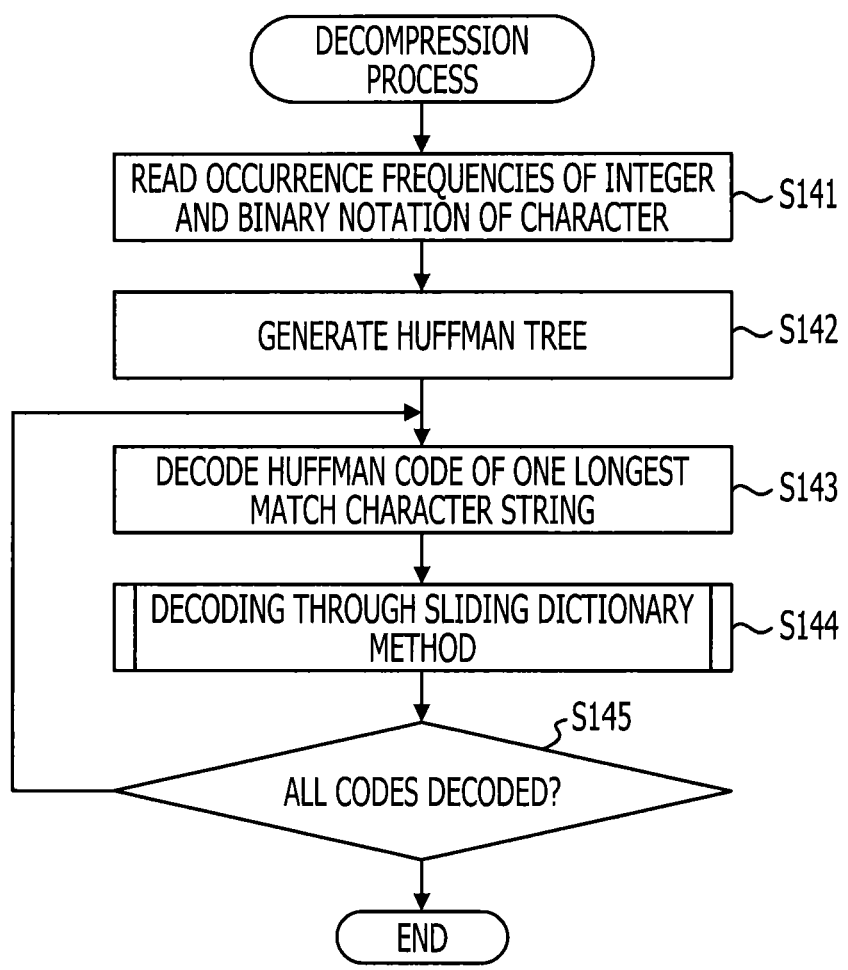
FIG. 19 is a flowchart illustrating a procedure example of a decompression process.

FIG. 19 is a flowchart illustrating a procedure example of the decompression process. The decompression process of FIG. 19 is described with reference to step numbers.

S141 The first decoding unit 131 reads the occurrence frequencies of the integer and the binary notation of the character from the header region 121a.

S142 The first decoding unit 131 generates a Huffman tree. For example, the first decoding unit 131 generates the Huffman tree to decompress the Huffman codes indicating the address (α and β) and the length, in accordance with the occurrence frequency of the integer. The first decoding unit 131 also generates the Huffman tree to decompress the Huffman code of the binary notation of the character, in accordance with the occurrence frequency of the binary notation of the character. The generation method of the Huffman tree is identical to the generation method of the Huffman tree in the data compression.

S143 The first decoding unit 131 decodes the Huffman codes of the longest match character string in the code region 121b of the compression file 121 in the order starting with the leading Huffman code. For example, if the longest match character string is represented by the address and the length, the first decoding unit 131 decodes the Huffman code indicating the address (α and β) and the length in accordance with the common Huffman tree. If the longest match character string is represented by the binary notation of the character, the first decoding unit 131 decodes the Huffman code indicating the binary notation of the tree in accordance with the Huffman tree of the binary notation of the character. The decompressed data (intermediate code) are stored on the intermediate code file 23.

S144 The second decoding unit 132 decodes the intermediate code in the intermediate code file 23 through the sliding dictionary method. The process in step S144 is described in detail below (see FIG. 20).

S145 The first decoding unit 131 determines whether all the codes in the code region 121b of the compression file 121 have been decoded. If all the codes have been decoded, the process ends. If any code remains undecoded, the first decoding unit 131 returns to step S143.

The codes in the code region 121b are thus decoded.

A procedure of the decoding process through the sliding dictionary method is described below.

Figure 20:
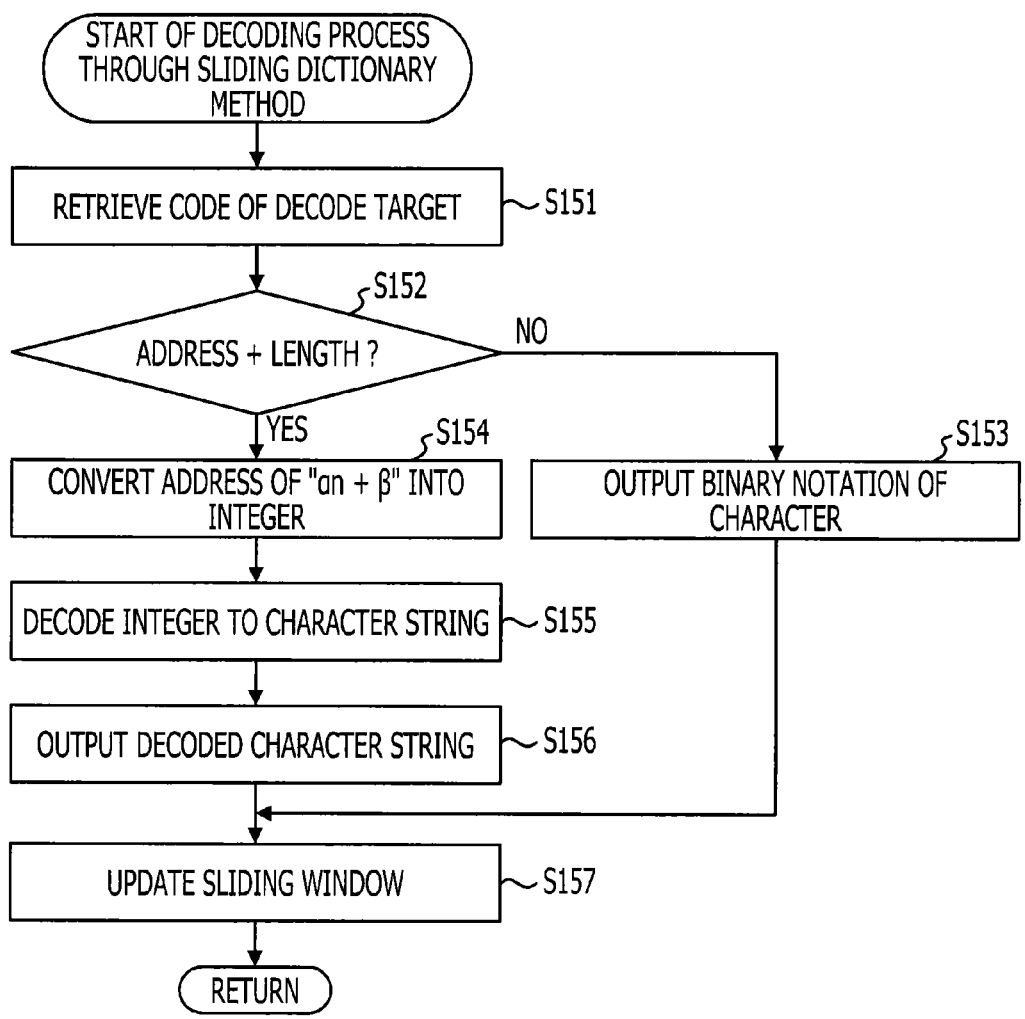
FIG. 20 is a flowchart illustrating a procedure example of a decoding process performed through a sliding dictionary method.

FIG. 20 is a flowchart illustrating a procedure example of the decoding process through the sliding dictionary method. The decoding process of FIG. 20 is described with reference to step numbers. It is noted that the sliding window is initially empty.

S151 The second decoding unit 132 retrieves from the intermediate code file 23 a code for one longest match character string (intermediate code) decoded by the first decoding unit 131.

S152 The second decoding unit 132 determines whether the retrieved intermediate code is in the format of the address and length, or in the binary notation of the character. If a leading flag of the intermediate code is "0," the second decoding unit 132 determines that the intermediate code is in the binary notation of the character. If the leading flag of the intermediate code is "1," the second decoding unit 132 determines that the intermediate code is in the address and length format. If the intermediate code is in the binary notation of the character, the second decoding unit 132 proceeds to step S153. If the intermediate code is in the format of the address and length, the second decoding unit 132 proceeds to step S154.

S153 If the intermediate code is in the binary notation of the character, the second decoding unit 132 outputs the binary notation of the character to the decompression file 24. The second decoding unit 132 then proceeds to step S157.

S154 If the intermediate code is in the format of the address and length, the second decoding unit 132 converts the address in the format of αn+β into an integer indicating an address. The second decoding unit 132 retrieves the period n responsive to the record length from the header region 121a. The second decoding unit 132 calculates "αn+β", thereby obtaining the integer indicating the address.

S155 The second decoding unit 132 decodes the integer indicating the address and the integer indicating the length into a character string. The second decoding unit 132 handles the integer indicating the address as an offset from the end of the character string within the sliding window that has undergone decoding, and detects a character at the position of the offset. The second decoding unit 132 retrieves from the detected characters a character string of the data length indicated by the length, and thus obtains the decoded character string.

S156 The second decoding unit 132 outputs the decoded character string to the decompression file 24.

S157 The second decoding unit 132 updates the data in the sliding window. For example, the second decoding unit 132 discards the leading character string in the sliding window corresponding to the number of decoded characters. The second decoding unit 132 then forward shifts the character strings in the sliding window by the number of decoded characters. The second decoding unit 132 stores the decoded character string at the end of the sliding window.

The codes corresponding to the longest match character string are thus decoded into the original longest match character string.

As described above, the offset from the end of the reference region 31 serves as the address in the encoding through the sliding dictionary method in the second embodiment. The address is in the format of "$\alpha n+\beta$." In this way, $\alpha$ and $\beta$ are localized in the vicinity of 0. In the Huffman coding, the integer having a higher occurrence frequency is encoded into a shorter code. For this reason, the compression efficiency is thus increased by encoding the integers localized in the vicinity of 0 into Huffman codes.

A third embodiment is described below. In the third embodiment, data compression is performed through a 1-pass method. The functional configuration to implement the third embodiment is identical to the functional configuration of the second embodiment of FIG. 3. A process of the third embodiment is described with reference to reference numbers illustrated in FIG. 3.

Figure 21:
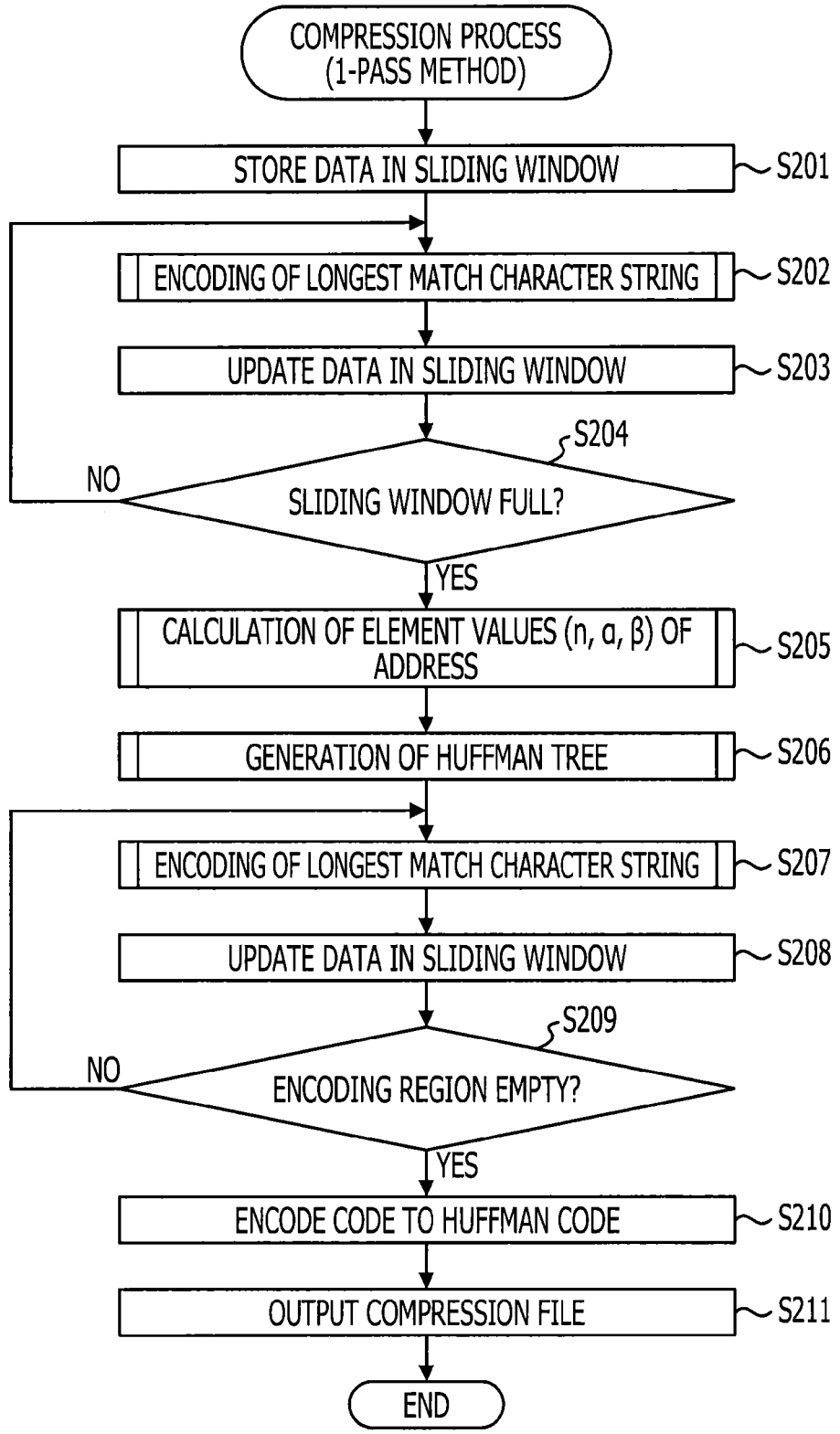
FIG. 21 is a flowchart illustrating a procedure example of a compression process through 1-pass method.

FIG. 21 is a flowchart illustrating a procedure example of a compression process through the 1-pass method. The compression process of FIG. 21 is described with reference to step numbers.

S201 The first encoding unit 111 reads the character strings in the original file 21 in the order starting with the leading character string, and then stores the read character string in the sliding window 30. For example, the first encoding unit 111 stores the character string in the encoding region 32 of the sliding window 30.

S202 The first encoding unit 111 encodes the longest match character string in the encoding region 32 using as a dictionary the character string stored in the reference region 31 of the sliding window 30. The detail of the process is identical to the encoding process (see FIG. 16) of the longest match character string in the second embodiment.

S203 The first encoding unit 111 updates the data in the sliding window 30. The detail of this process is identical to the process in step S103 of FIG. 15.

S204 The first encoding unit 111 determines the sliding window 30 is full of character strings. If the sliding window 30 is full of the character strings, the first encoding unit 111 proceeds to step S205. If the sliding window 30 is not full of character strings, the first encoding unit 111 returns to step S202.

S205 The first encoding unit 111 calculates the element values (n, $\alpha$, $\beta$) of the address of the longest match character string. The detail of this process is identical to the process of the second embodiment illustrated in FIG. 17.

S206 The second encoding unit 112 generates a Huffman tree. For example, the second encoding unit 112 generates the Huffman trees respectively for $\alpha$ and $\beta$ for the address "$\alpha n+\beta$." If the characteristics of the occurrence frequencies of $\alpha$ and $\beta$ are similar, the second encoding unit 112 generates a single Huffman tree in accordance with the occurrence frequencies of the integers of $\beta$ and $\beta$. The detail of the Huffman tree generation process is identical to the process of the second embodiment illustrated in FIG. 18.

S207 The first encoding unit 111 performs the encoding process of the longest match character string again. For example, the first encoding unit 111 resumes the encoding process on a next character of the character string encoded in step S202.

S208 The first encoding unit 111 updates the data in the sliding window 30 in the same manner as in step S203.

S209 The first encoding unit 111 determines whether the encoding region 32 of the sliding window 30 becomes empty. If the encoding region 32 of the sliding window 30 becomes empty, the first encoding unit 111 proceeds to step S210. If an unencoded character string still remains in the encoding region 32 of the sliding window 30, the first encoding unit 111 returns to step S207.

S210 The second encoding unit 112 encodes a code string in the intermediate code file 22 (the address, the length, and the binary notation of the character) into Huffman codes. If the address is expressed in the format of $\alpha n+\beta$ as illustrated in FIG. 13, $\alpha$ and $\beta$ are separately encoded. The second encoding unit 112 encodes $\alpha$, $\beta$, the length, and the binary notation of the character using different Huffman trees. If the frequency characteristics of $\alpha$ and $\beta$ are similar, the second encoding unit 112 encodes $\alpha$ and $\beta$ using a common Huffman tree.

S211 The second encoding unit 112 outputs the compression file 121.

The Huffman code generation process is facilitated by generating a Huffman tree using part of the intermediate code in this way. A high-speed compression process thus results.

A fourth embodiment is described below. The fourth embodiment is related to a data compression process that is appropriate if there is no periodicity of record length. A difference between the second embodiment and the fourth embodiment is described below.

FIGS. 4 through 13 illustrate the encoding through the sliding dictionary method to compress a file of a database, such as a database of personal name list. The database file includes an item common to the records, and character strings of each item appear with a periodicity of the record length. On the other hand, other data are not so likely to have a periodicity responsive to the record length as the database of the personal name list. For example, the character strings in a dictionary, such as of a national language, are not so expected to have a periodicity responsive to the record length as the personal name list.

In the fourth embodiment, the address and the length of the longest match character string of the second embodiment are adjusted to be close to 0 as follows: Adjusted address: (offset from the end of the reference region to the front of the longest match character string)−(length of the longest match character string), and adjusted length: (length of the longest match character string)−3.

The adjusted address indicates the offset from the end of the reference region to the end of the longest match character string.

The adjusted length is a length having a starting value of the integer indicating the length shifted to 0. More specifically, since the longest match character string is not "0," "0" is not used as an integer to express a pre-adjusted length. If the length of the longest match character string is 2 bytes or shorter, the binary notation of the character string is output as an intermediate code in the same manner as in the second embodiment. The integers 1 and 2 are not used to express a pre-adjusted length. In this way, the integers 0 through 2 are not used to express the pre-adjusted length. In the fourth embodiment, integer series "3, 4, 5, . . . " are adjusted to be integer series "0, 1, 2, . . . " starting with "0." In this way, the integer indicating the length is localized in the vicinity of 0. During the decompression, a value resulting from adding "3" to the integer indicating the length after decoding becomes the length of the longest match character string.

Figure 22:
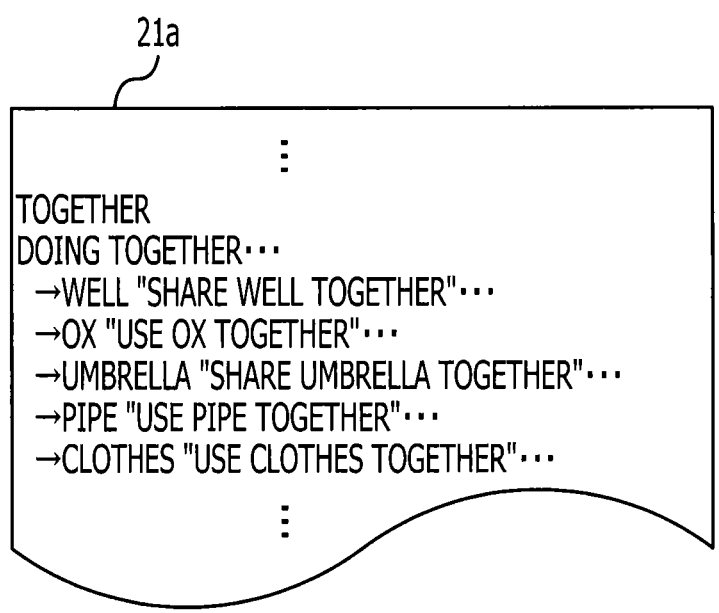
FIG. 22 illustrates another example of the original file.

FIG. 22 illustrates another original file 21a. The original file 21a of FIG. 22 stores dictionary data used in an electronic dictionary as compression target character strings. As illustrated in FIG. 22, a text file (such as extensive hypertext markup language (XHTML) file) of an electronic dictionary or a digital book includes heading and description. Character strings of terms related to the heading and basic terms are repeated. In the example of FIG. 22, the character string "together" repeatedly appears. Used as an address of the longest match character string in the dictionary data, such as the dictionary data, is an offset from the end of the reference region 31 to the end of the longest match character string.

Figure 23:
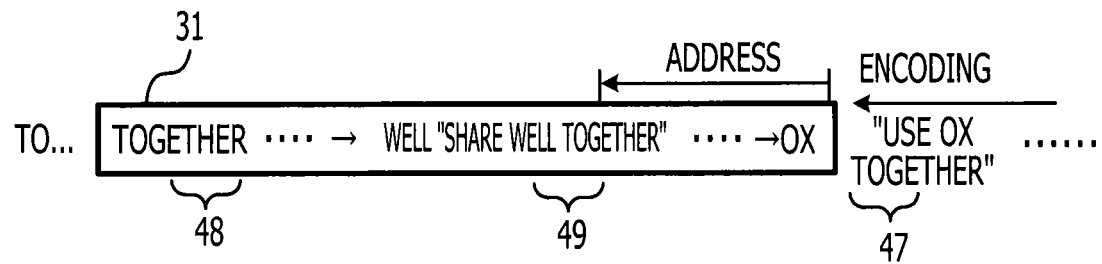
FIG. 23 illustrates another example of the address modification that is performed on the longest match character string with an offset from the end of the reference region.

FIG. 23 illustrates another example of the address modification of the longest match character string performed with the offset from the end of the reference region 31. In the example of FIG. 23, a character string "use ox together" in the dictionary data is in the front of the encoding region 32. The eight characters in the encoding region 32 is set to be the longest match character string 47, and two longest match character strings 48 and 49 are thus detected from the reference region 31. The longest match character string 47 in the encoding region 32 is encoded using the longest match character string 49 closer to the end of the reference region 31.

The address and the length of the longest match character string 49 are determined during the encoding. The offset from the end of the reference region 31 to the end of the longest match character string 49 is set to be an address of the longest match character string 49. The address and the length thus determined have characteristics described below.

Figure 24:
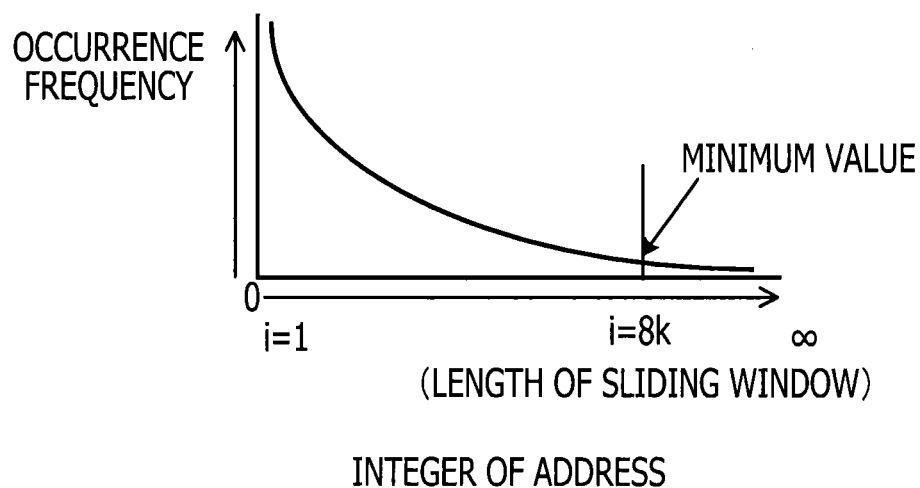
FIG. 24 illustrates characteristics of an integer indicating an address.

FIG. 24 illustrates the characteristics of the integer indicating the address. In FIG. 24, the abscissa represents the value of the integer indicating the address, and the ordinate represents the occurrence frequency of the value of the integer indicating the address. As illustrated in FIG. 24, the higher the value of the integer indicating the address is, the lower the occurrence frequency of the integer is. In other words, the value of the integer indicating the address is localized in the vicinity of 0. In FIG. 24, the size of the reference region 31 of the sliding window 30 is infinite ($\infty$). In practice, however, the size of the reference region 31 is finite. For this reason, the data length of the reference region 31 of the sliding window 30 is a maximum value of the integer indicating the address, and the occurrence frequency with the integer indicating the address at a maximum value is a minimum value.

Figure 25:
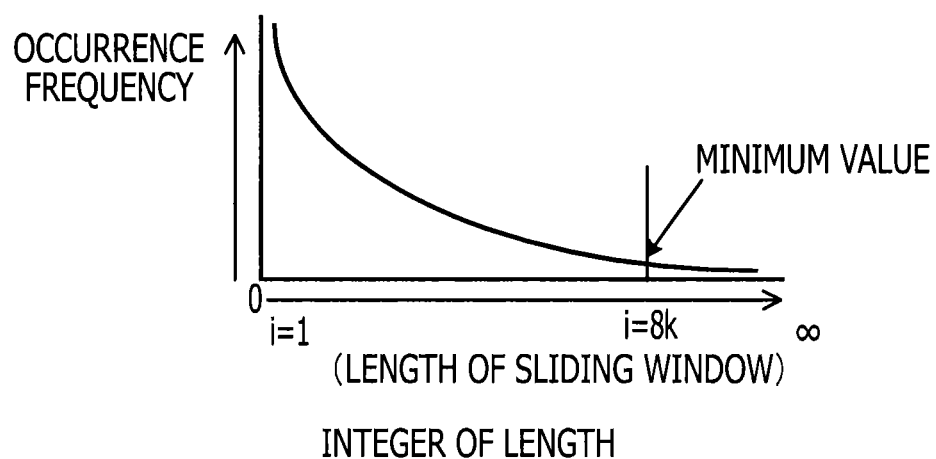
FIG. 25 illustrates characteristics of the integer indicting the address.

FIG. 25 illustrates the characteristics of the integer indicating the length. In FIG. 25, the abscissa represents the value of the integer indicating the length, and the ordinate represents the occurrence frequency of the value of the integer indicating the length. As illustrated in FIG. 25, the higher the value of the integer indicating the length is, the lower the occurrence frequency of the integer is. In other words, the value of the integer indicating the length is localized in the vicinity of 0. In FIG. 25, the size of the reference region 31 of the sliding window 30 is infinite ($\infty$). In practice, however, the size of the reference region 31 is finite. For this reason, the data length of the reference region 31 of the sliding window 30 is a maximum value of the integer indicating the address, and the occurrence frequency with the integer indicating the length at a maximum value is a minimum value.

The codes resulting from encoding the data of the electronic dictionary through the sliding dictionary method are thus localized in the vicinity of 0. The degree of localization of the value of integers indicating addresses to the vicinity of 0 is particularly increased by setting the offset from the end of the reference region 31 to the end character of the longest match character string to be the address.

A control method of the sliding window and a calculation method of the address are described in detail below.

The sliding window 30 is a buffer of first-in first-out (FIFO) type. Character strings are successively input as an encoding target to the sliding window 30. When the sliding window 30 is full of character strings, the oldest character string is discarded on a FIFO basis. If such an operation is understood as a shift of the sliding window 30 on the character strings, the shift operation is illustrated in FIG. 26.

Figure 26:
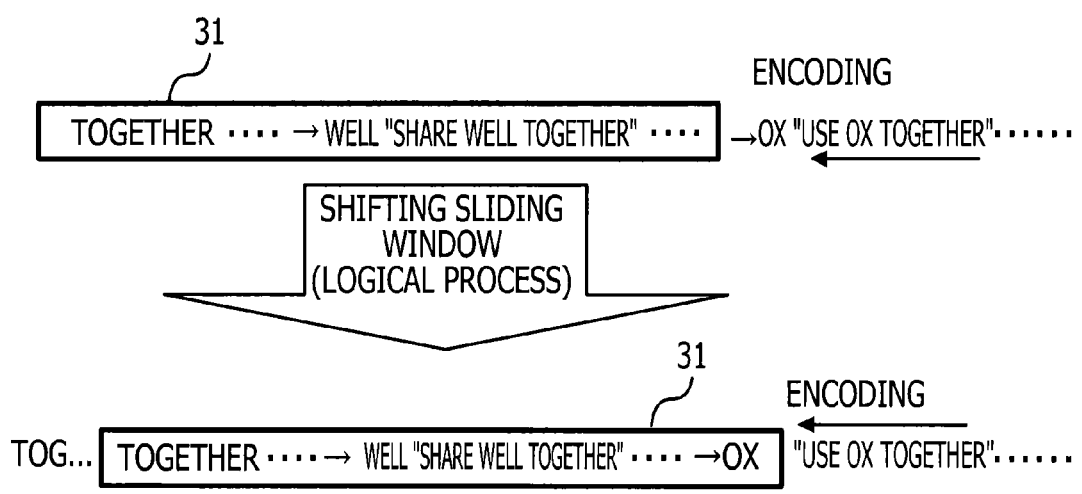
FIG. 26 illustrates a shifting operation of the sliding window.

FIG. 26 illustrates the shifting of the sliding window 30. In FIG. 26, a logical shift of the reference region 31 of the sliding window 30 is illustrated. FIG. 26 illustrates the sliding window 30 in a shifted position after the two-character string "ox" is encoded. Since the two-character string "ox" is encoded, the reference region 31 shifts on the character strings by two characters. As a result, two characters "to" are pushed out from the front of the reference region 31, followed by the addition of the two character "ox" to the end of the reference region 31. The encoding region 32 shifts in the same manner as the reference region 31.

FIG. 26 illustrates the shifting of the sliding window 30 as a logical process. The sliding window 30 is a buffer. In practice, the writing of the character on the buffer updates the data in the sliding window 30.

Figure 27:
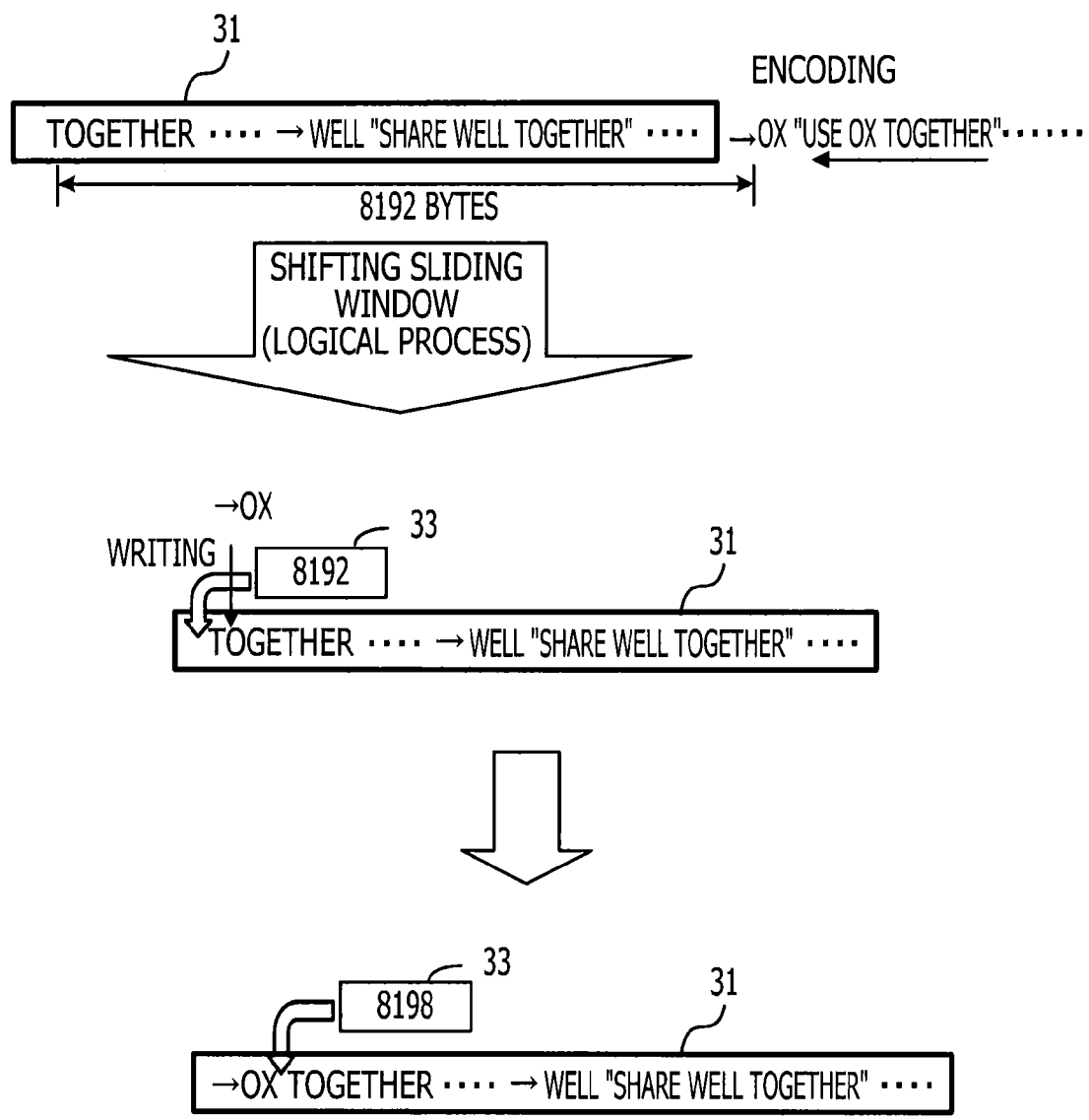
FIG. 27 illustrates an update operation of the longest match character string within the sliding window.

FIG. 27 illustrates an update example of the character string in the sliding window 30. The first encoding unit 111 includes an encoding counter 33. The encoding counter 33 indicates a size of encoded character strings. For example, the size of encoded character strings is indicated in bytes on the encoding counter 33. A remainder resulting from dividing the count of the encoding counter 33 by the length of the reference region 31 (data amount) becomes an offset from the front of a physical area of the reference region 31 to a next area following the logical end character of the reference region 31. The next area following the logical end character of the reference region 31 indicates a write position where a next character string is to be written on the reference region 31.

When a character string is encoded, the encoded character string is written on a write position as a start position on the reference region 31. If a character string is already written on the write position, the subsequent character string overwrites the already written character string. Each time the encoding of a character string is complete, the encoding counter 33 counts up the count thereof by the encoded character string (byte number, for example).

The length of the reference region 31 may now be 8192 bytes. When character strings of 8192 bytes are encoded, the reference region 31 is full of the character strings. The count of the encoding counter 33 is then "8192."

The character string "ox" has now been encoded. The character string "ox" is written in the front of the reference region 31. Since the character string "ox" is two one-byte characters, the character string of two bytes is now encoded. The encoding counter 33 thus counts up the count by 6. As a result, the encoding counter 33 updates the count from "8192" to "8198."

The character string in the encoding region 32 may be updated in the same manner as the reference region 31, using the count at the encoding counter 33.

The physical writing to the buffer of the sliding window 30 is performed cyclically. An amount of data to be written during the updating of the character string in the sliding window 30 is small, and the speed of the compression process is increased. The same control process of the sliding window may also be performed during the decompression process, and the speed of the decompression process is increased. In the second embodiment as well, the speed of the compression and decompression process may be increased by updating the character string in the sliding window 30 using the method of FIG. 27.

When the longest match character string is searched for in the reference region 31 having the physical region of FIG. 27, the search operation is performed in the logical direction from the leading character to a subsequent character in the reference region 31.

Figure 28:
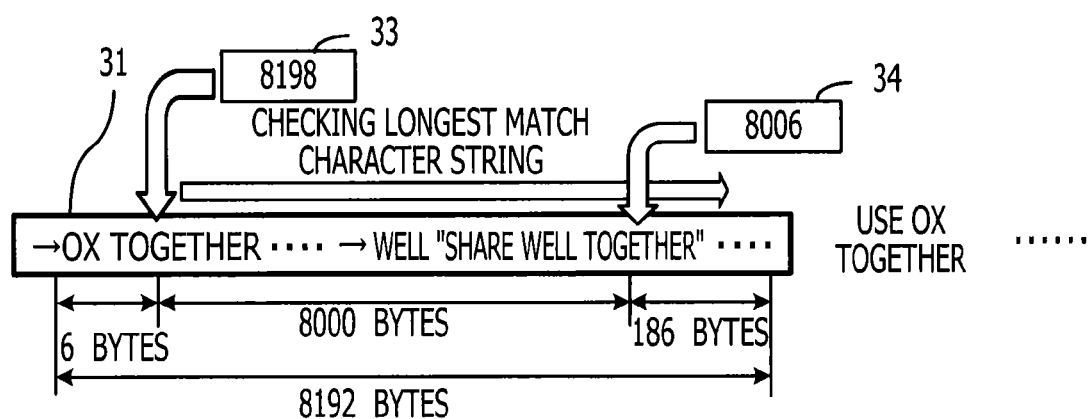
FIG. 28 illustrates a search operation of the longest match character string.

FIG. 28 illustrates a search example of the longest match character string. As illustrated in FIG. 28, the data of the electronic dictionary are encoded through the sliding dictionary method, and the offset to the end of the longest match character string is set to be the address thereof.

In FIG. 28, the longest match character string for the character string "use ox together" is searched for, and a character string of "together" is detected at two locations. In such a case, the backward character string of the reference region 31 (closer to the end of the reference region 31) is detected as the longest match character string.

If the longest match character string is detected, the position of the longest match character string detected is represented by the offset from the physical front of the reference region 31. The first encoding unit 111 sets, in a detection position pointer 34, the offset of the position of the end character of the longest match character string from the physical front of the reference region 31. The first encoding unit 111 calculates the address of the longest match character string in accordance with the following expression:

Address of the longest match character string=(count at the encoding counter)−(value of the detection position pointer)−(data length of the reference region)×m     (1)

where m is an integer equal to or larger than 0. The first encoding unit 111 determines a maximum value of m that causes the value of (data length of the reference region)×m to be smaller than the value of {(count at the encoding counter)−(value of the detection position pointer)}, and then calculates the expression (1) using the maximum value of m.

The address of the longest match character string may be determined by dividing the value of {(count at the encoding counter)−(value of the detection position pointer)} by (data length of the reference region). In such a case, the remainder of the division operation becomes the address of the longest match character string.

As illustrated in FIG. 28, the logical front of the reference region 31 is a seventh character from the physical front thereof. The character string "together" at 8000th byte from the logical front of the reference region 31 is detected as the longest match character string. The detected longest match character string is at the position of 186 bytes from the physical end of the reference region 31. A character of 6 bytes is present prior to the logical front character in the physical area of the reference region 31. The offset from the logical end of the reference region 31 to the end character of the longest match character string is "192."

The values illustrated in FIG. 28 are now applied to the expression (1). The count at the encoding counter 33 is "8198." The value at the detection position pointer 34 is "8006." The value of {(count at the encoding counter)−(value of the detection position pointer)} becomes "192." The data length of the reference region is "8192." If the expression (1) is calculated with "m=0," the address of the longest match character string is "192." The correct result is thus obtained.

If the offset to the front of the longest match character string is set to be the address as in the second embodiment, the offset indicating the position of the leading character of the longest match character string may be set at the detection position pointer 34.

Described below is a method of dividing the addresses of the longest match character string and representing a divided address with a plurality of integers in the vicinity of 0. In the data such as of an electronic dictionary, the address is difficult to represent using the format $\alpha n \pm \beta$ as in the second embodiment. In the fourth embodiment, if the integers indicating the addresses are represented by a binary notation, the integers are divided into a lower integer having a digit number that is equal to or lower than a specific threshold value and an upper integer having a digit number that is higher than the specific threshold value. If the integers of the address and the length have the characteristics that the higher the value of each integer is, the lower the occurrence frequency becomes as illustrated in FIGS. 24 and 25, the lower integer has a higher occurrence frequency than the upper integer. In the following discussion, the lower integer is referred to as a high-frequency integer and the upper integer is referred to as a low-frequency integer.

Figure 29:
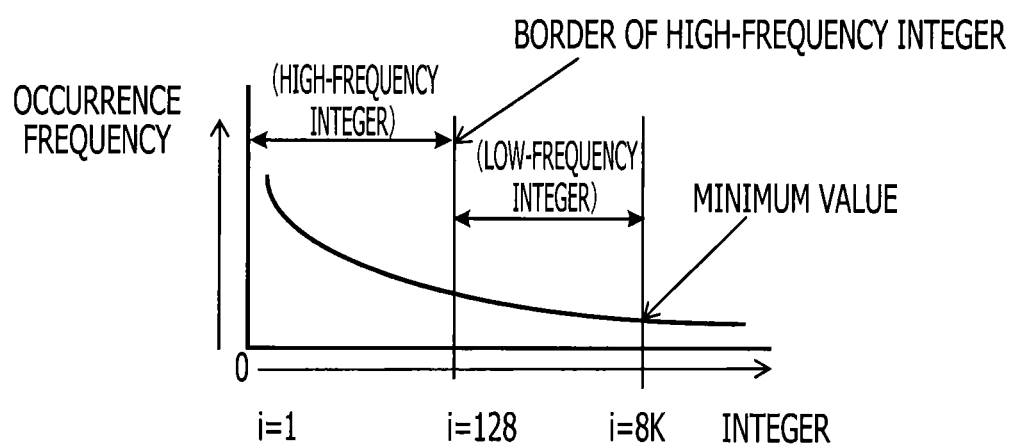
FIG. 29 illustrates a division operation of the integers indicating the addresses.

FIG. 29 illustrates an example of division of the integers indicating the addresses. In FIG. 29, the abscissa represents the value of an integer indicating an address, and the ordinate represents the occurrence frequency of the value of the integer indicating the address. In the example of FIG. 29, the data length of the reference region 31 in the sliding window 30 is 8 K (8192) bytes.

The occurrence frequency of the integer indicating the address decreases as the value of the integer increases. If the data length of the reference region 31 is 8 Kbytes, the maximum value of the integers indicating the addresses is 8 K (8192). As for the length of the longest match character string, the integer "128" is set to be a boundary value of the high-frequency integer, and an integer equal to or smaller than the boundary value is set to be a high-frequency integer, and an integer larger than the boundary value is set to be a low-frequency integer. The boundary value is an example of the threshold value of the digit number of the address. The boundary value "128" is equal to a boundary value "7" of bit number in the binary notation.

If integers 1 through 8192 are divided, the high-frequency digits (1 through 128) are represented by 7 bits. The low-frequency integers (129 through 8192) are represented by a combination of upper 3 bits, intermediate 3 bits, and lower 7 bits, and are thud divided into three segments.

Figure 30A:
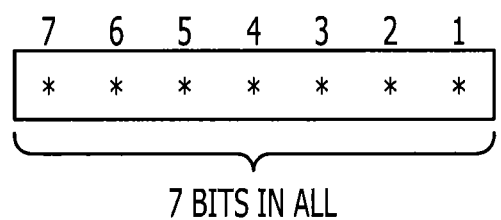
FIG. 30A illustrates an example of a bit structure of a high-frequency integer.
Figure 30B:
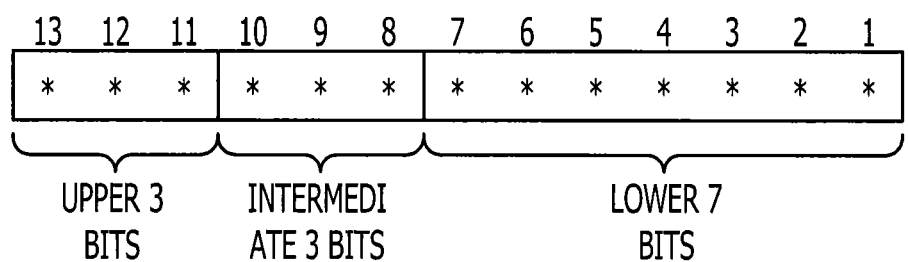
FIG. 30B illustrates an example of a bit structure of a low-frequency integer.

FIG. 30A illustrates a bit structure of the high-frequency integer. As illustrated in FIG. 30A, the high-frequency integer is represented by 7 bits in all. FIG. 30B illustrates a bit structure of the low-frequency integer. As illustrated in FIG. 30B, the low-frequency integer is represented by 13 bits. All 7 bits, if 0, represent an integer "1" indicating an address. More specifically, a value resulting from adding 1 to a value represented by 7 bits is an integer indicating an address.

The low-frequency integer is segmented into the upper 3 bits, the intermediate 3 bits, and the lower 7 bits. With the low-frequency integer divided in this way, the following characteristics are statistically estimated. The lower 7 bits of the low-frequency integer have characteristics similar to those of the 7 bits of the high-frequency integer. The upper 3 bits of the low-frequency integer have characteristics similar to those of the intermediate 3 bits of the low-frequency integer.

In the fourth embodiment, the second encoding unit 112 encodes the lower 7 bits of the low-frequency integer into a code common to the high-frequency integer. The second encoding unit 112 encodes the upper 3 bits of the low-frequency integer into a code common to the intermediate 3 bits of the low-frequency integer. The encoding performed in this way reduces the number of Huffman trees from 8192 to 136 (128+8). As a result, the size of Huffman trees is reduced, and the efficiency of the compression and decompression is increased.

FIG. 31 illustrates an example of compression and decompression count when the low-frequency integer is segmented. If the boundary value of the high-frequency integer is set to be 128, the high-frequency integers of 1 through 128, i.e., 1 through 7 bits representing the high-frequency integers are targets of the compression and decompression process. The compression count or the decompression count of the high-frequency integers of 1 through 7 bits is one.

The lower 7 bits out of the intermediate 3 bits and the lower 7 bits representing the low-frequency integers "129 through 1024" are regarded as a high-frequency integer and then compressed or decompressed. The intermediate 3 bits are separately compressed or decompressed. The intermediate 3 bits and the lower 7 bits of the low-frequency integers of "129 through 1024" are separately compressed or decompressed. The compression count or the decompression count of the intermediate 3 bits and the lower 7 bits are two.

The lower 7 bits of the 13 bits representing the low-frequency integers of "1025 through 8192" are regarded as a high-frequency integer and then compressed or decompressed. The intermediate 3 bits, and the upper 3 bits are regarded as intermediate 3 bits representing low-frequency integers "129 through 1024" and are separately compressed or decompressed. The lower 7 bits, the intermediate 3 bits, and the upper 3 bits of "1025 through 8192" out of the low-frequency integers are separately compressed or decompressed. The compression count or the decompression count is 3.

A Huffman tree generation process performed when the low-frequency integers are segmented into a plurality of segments is discussed below.

Figure 32:
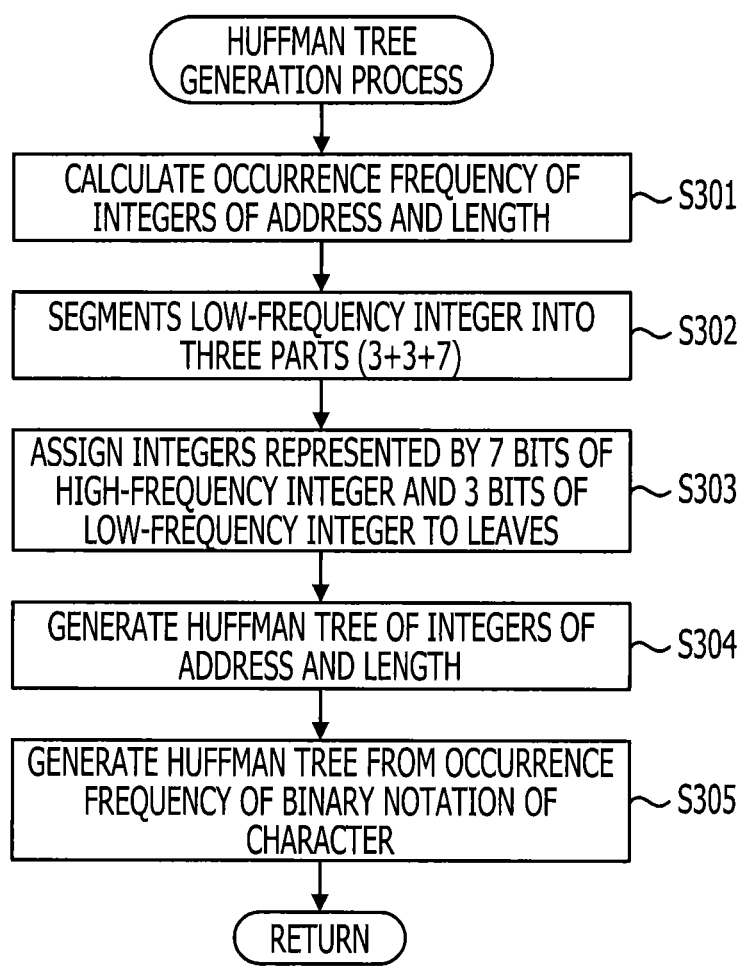
FIG. 32 illustrates a procedure example of the Huffman tree generation process of a fourth embodiment.

FIG. 32 illustrates an example of the Huffman tree generation process of the fourth embodiment. The Huffman tree generation process of FIG. 32 is described with reference to step number.

S301 The second encoding unit 112 calculates the occurrence frequencies of the integer indicating the address and the integer indicating the length.

S302 The second encoding unit 112 segments the low-frequency integer into the upper 3 bits, the intermediate 3 bits, and the lower 7 bits.

S303 The second encoding unit 112 generates leaves respectively corresponding to 128 integers represented by the 7 bits of the high-frequency integer, and 8 integers corresponding to the intermediate 3 bits of the low-frequency integer. An assigned integer and the occurrence frequency of the integer are set in the structural body of each leaf.

S304 The second encoding unit 112 generates a Huffman tree common to the integer indicating the address and the integer indicating the length. For example, the second encoding unit 112 generates the Huffman tree using the occurrence frequency of an integer having a high frequency, and the occurrence frequency of an integer represented by the intermediate 3 bits of low-frequency integer. The use of a Huffman tree common to the integer indicating the address and the integer indicating the length reduces resources such as a memory for use in the compression and decompression process.

S305 The second encoding unit 112 generates a Huffman tree in accordance with the occurrence frequency of the binary notation of each character.

The Huffman tree to encode the address and the length and the Huffman tree to encode the binary notation of the character are thus generated.

According to the fourth embodiment, the low-frequency integer is segmented into a plurality of segments and the lower 7 bits are treated in the same manner as the high-frequency integer in the generation of the Huffman tree to encode the address and the length. The upper 3 bits of the low-frequency integer are treated in the same manner as the intermediate 3 bits. The number of leaves is thus reduced, and the structure of the Huffman tree is simplified. A simplified Huffman tree increases the speed of the compression and decompression process.

The low-frequency integer out of the integers indicating the address and the length is segmented into the plurality of segments. Even if a constraint is imposed on the data length of the integer indicating the address or the length to be Huffman encoded, the constraint is relaxed. For example, a constraint of 256 (8 bits) is imposed on the length of the longest match character string in LHA compression which is a combination of LZ77 coding (using the sliding dictionary method) and the Huffman coding. The integer indicating the address or the length is 13 bits prior to the segmentation in the above example. The integer after the segmentation is limited to 8 bits or shorter. As a result, the integer is free from the length constraint on the Huffman coding in LHA.

In the above example, the low-frequency integer is segmented into the three segments. For example, the segmentation of the low-frequency integer into only two segments still reduces the number of leaves of the Huffman tree.

Figure 33A:
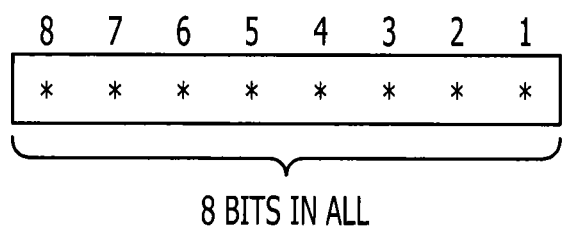
FIG. 33A illustrates another example of the division of the high-frequency integers.
Figure 33B:
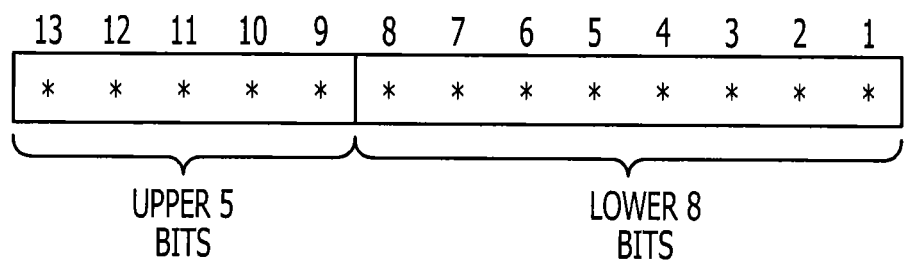
FIG. 33B illustrates another example of the division of the low-frequency integers.

FIG. 33A illustrates another example of the segmentation of the high-frequency integer. FIG. 33B illustrates another example of the segmentation of the low-frequency integer. As illustrated in FIG. 33A, the boundary value of the high-frequency integer is set to be "256." In such a case, 1 through 256 become high frequency integers. The high-frequency integer is represented by 8 bits in all. Here 256 leaves with integers represented by 8 bits respectively assigned thereto are generated.

The low-frequency integer represented by 13 bits in all is segmented into upper 5 bits and lower 8 bits. The lower 8 bits are regarded as a high-frequency integer and are encoded. Here 32 leaves with 32 integers represented by 8 bits respectively assigned thereto are generated.

The number of Huffman trees generated is "288" (256+32). The number of leaves of the Huffman tree is thus reduced.

A fifth embodiment is described below. In the fifth embodiment, in place of the Huffman tree, a nodeless tree is generated in the compression and decompression process.

In the nodeless tress as in the Huffman tree, a symbol (such as a character or an integer) having a high occurrence frequency is encoded in a shorter code. In the Huffman tree, however, a plurality of nodes is arranged below the root thereof. The nodeless tree has no nodes below the root, but all the leaves are directly connected to the root. If the nodeless tree having this structure is used, compression codes are decompressed by a unit of encoding of several bits instead of a unit of encoding of 1 bit. The decompression speed is increased.

When the nodeless tree is generated, a code length during encoding is determined in accordance with the occurrence frequency of each integer.

FIG. 34 illustrates an example of a relationship between the occurrence frequency of the integer and the code length. FIG. 34 illustrates a table that lists, with respect to an integer, occurrence count, occurrence frequency, correction probability, code length, and compression code.

The second encoding unit 112 calculates the occurrence count of each integer, and determines the occurrence frequency of the integer. The occurrence frequency is a ratio of the occurrence count of a specific integer to the occurrence frequency of all the integers.

The second encoding unit 112 determines the correction probability in accordance with the occurrence frequency. The correction probability is one of powers of "½" that is largest but equal to or smaller than the occurrence frequency. For example, an occurrence frequency of "0.137" is smaller than "¼ (0.25) but higher than "⅛ (0.125)". The correction probability of the occurrence frequency of "0.137" is ⅛.

The second encoding unit 112 determines the code length in accordance with the correction probability. The code length is a bit number of the code. For example, if the correction probability is expressed using a power of ½, an exponent of the expression is the code length. If the correction probability is ⅛, the code length is 3 because ⅛ is ½ to the third power.

The second encoding unit 112 determines the compression code of each integer as a code of the code length determined in accordance with the occurrence frequency of the integer. For example, if the code length is "3," the compression code is "000." If the code length is "4," the compression code is "0010." The second encoding unit 112 encodes the integers indicating the address and the length into compression codes as listed in FIG. 34.

The nodeless tree is thus generated in accordance with an association relationship between the integer and the compression code. If the low-frequency integer is segmented as illustrated in FIG. 30, the number of leaves is 136. The number of leaves is thus represented by 8 bits. An example of the nodeless trees with a maximum number of bits of the code being 8 is described with reference to FIG. 35.

Figure 35:
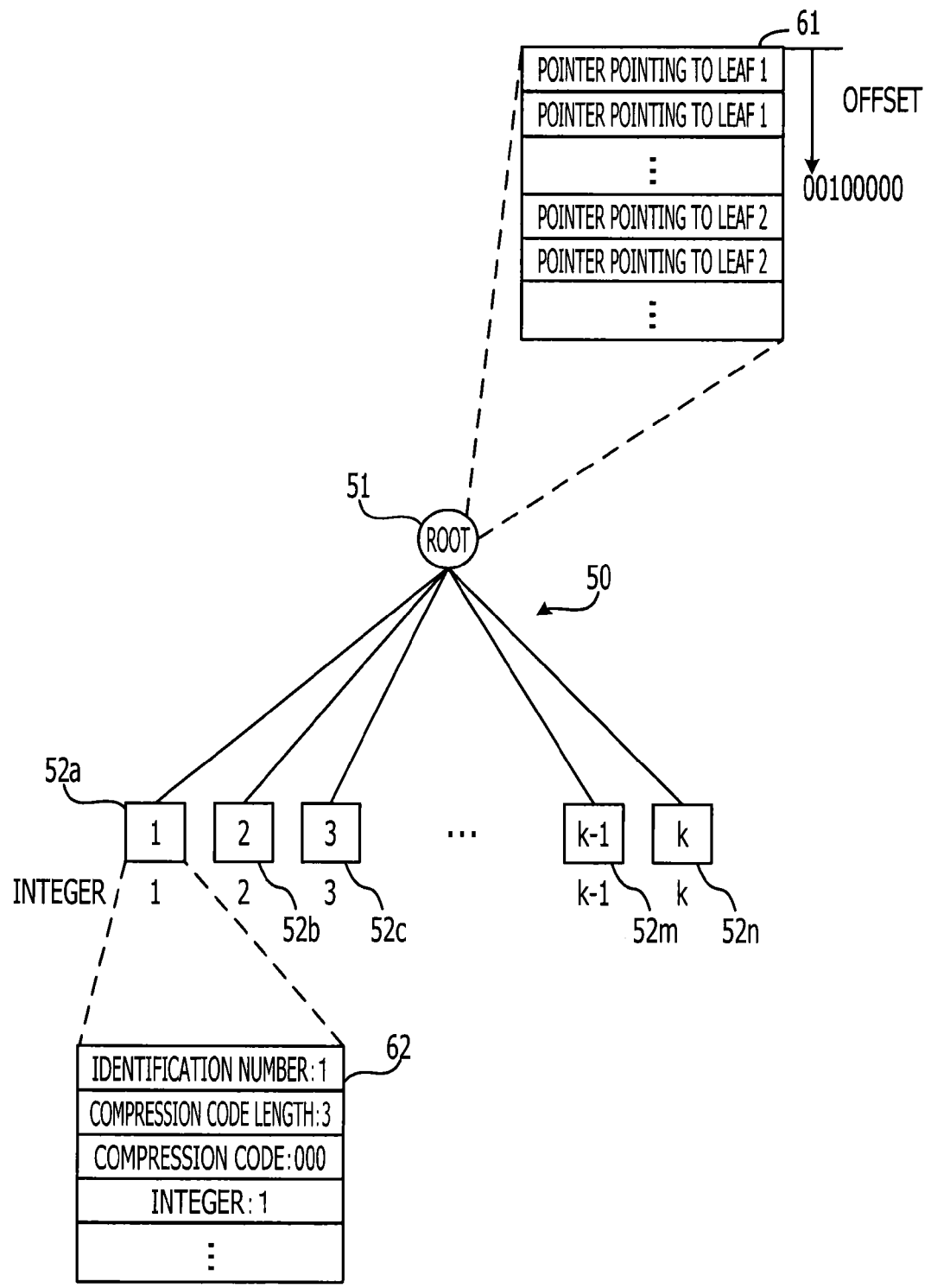
FIG. 35 illustrates an example of a nodeless tree.

FIG. 35 illustrates an example of a nodeless tree 50. The nodeless tree 50 includes a root 51, and leaves 52a, 52b, 52c, . . . , 52m, and 52n. The leaves 52a, 52b, 52c, . . . , 52m, and 52n are arranged immediately below the root 51. Unlike the Huffman tree, the nodeless tree 50 includes no node. Identification numbers of the leaves 52a, 52b, 52c, . . . , 52m, and 52n are 1, 2, 3, . . . in the order from left to right side.

A root structure 61 of the root 51 includes pointers, pointing to the leaves 52a, 52b, 52c, . . . , 52m, and 52n, set in regions corresponding to the addresses represented by 8 bits. Set in a leaf structure 62 are an identification number, a compression code length, a compression code, an integer (symbol to be compressed) of a corresponding leaf 52a, for example.

The shorter compression code the leaf has, the more pointers the root structure 61 is able to have. For example, the compression code length of the leaf 52a may be "3," and the compression code may be "000." The leaf 52a of the root structure includes pointers to the leaf 52a in all the regions in an address range from "00000000" through "00011111."

The nodeless tree 50 allows the decoding process to be performed by a unit of encoding. For example, the first decoding unit 131 retrieves a value of the leading 8 bits of a code string as a decoding target, and references a pointer stored in the region having an offset as the retrieved value, starting with the front of the root structure 61. The first decoding unit 131 then references the leaf structure indicated by the referenced pointer. The first decoding unit 131 decodes leading bits of a bit number indicated by the compression code length indicated by the referenced leaf structure, out of the retrieved 8 bits, into an integer indicated by the reference leaf structure. The first decoding unit 131 retrieves leading 8 bits of an undecoded code string again, and then performs the same decoding process.

If the retrieved 8 bits are "00000111," the region of the corresponding offset is referenced. The region has a pointer to the leaf structure 62 corresponding to the leaf 52a. The leaf structure 62 indicates that the compression code is "3," and that the retrieved bits are decoded into the integer "1." The first decoding unit 131 decodes leading 3 bits "000" of the 8 bits "00000111" into the integer "1."

The decoding process through the nodeless tree 50 is thus free from a plurality of determination operations that are performed in the decoding process through the Huffman tree to trace from the root to the node. A target leaf is detected from the root 51 through the 1-pass, and then decoding process is performed. More specifically, the nodeless tree 50 allows the leaf structure to be retrieved in a single determination operation with 8 bits of compression data handled at a time, not with 1 bit of the compression data at a time. The decompression speed of the compression code is thus increased.

A program describing the process content discussed in each of the embodiments is provided to cause the computer 100 to perform the process of each embodiment. The process is performed by the computer 100 when the computer 100 executes the program. The program describing the process content may be recorded on a computer readable recording medium. The computer readable recording media include magnetic recording device, optical disk, magneto-optical recording disk, and semiconductor memory. The magnetic recording devices include a hard disk drive (HDD), flexible disk (FD), and magnetic tape. The optical disks includes digital versatile disk (DVD), DVD-RAM, and CD-ROM/RW. The magneto-optical recording disk includes a magneto-optical disk (MO). The recording medium that records the program does not include a transitory propagating signal itself.

To distribute the program, a mobile recording medium, such as the DVD, and the CD-ROM, storing the program may be sold. The program may be stored on the recording device in a server computer, and then may be transmitted to another computer from the server computer via a network.

The computer executing the program stores on a recording device thereof the program recorded on a mobile recording medium or transmitted from the server computer. The computer then reads the program from the recording device thereof, and then performs a process responsive to the program. Alternatively, the computer may read the program directly from the mobile recording medium, and may perform the process responsive to the program. The computer may also perform the process responsive to the program each time the computer receives the program from the server computer.

At least part of the process may be implemented using an electronic circuit, such as a digital signal processor (DSP), an application specific integrated circuit (ASIC), a programmable logic device (PLD), or the like.

The embodiments have been discussed. Each element in each of the embodiments may be replaced with another element having an equivalent function. Any optional element or an optional step may be added to the apparatus or the process. Any two or more elements (features) of each of the embodiments may be combined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An encoding method, comprising:
   searching a search target symbol string within a specific range from the end of a symbol string, which has been utilized for encoding, for a match symbol string corresponding to a beginning symbol string of a symbol string to be encoded; and
   encoding the beginning symbol string based on a distance between the match symbol string and the beginning symbol string, and a length of the match symbol string, by a processor.

2. The encoding method according to claim 1, wherein the encoded beginning symbol string further encoded so that a value of the encoded beginning symbol string having a higher occurrence frequency is encoded into a shorter code.

3. The encoding method according to claim 1, wherein the search target symbol string is stored on buffer, and each time the beginning symbol string is encoded, a symbol string that is encoded first on the buffer is overwritten by the beginning symbol string.

4. The encoding method according to claim 3, wherein the distance is calculated based on a difference resulting from subtracting the sum of an offset the beginning of the buffer to the position of the match symbol string and a specific number multiple of a storage capacity of the buffer, from a count of a counter indicating the number of encoded symbol strings.

5. The encoding method according to claim 1, wherein the beginning symbol string is further encoded by encoding each of values of $\alpha$ and $\beta$, and
   the values of $\alpha$ and $\beta$ calculated by converting the distance into a format of $\alpha n \pm \beta$,
   the value n is a period of peaks of the frequency occurrence of the distance,
   the value n represents an integer equal to or larger than 1,
   the value $\alpha$ represents an integer equal to or larger than 1, and
   the value $\beta$ represents an integer equal to or larger than 0.

6. The encoding method according to claim 1, wherein the distance is encoded by using a tree structured data, the tree structured data is generated by a processing, the processing including:
   dividing a value of the distance into a lower value having a digit number equal to or lower than a threshold value and an upper value having a digit number higher than the threshold value;
   segmenting the upper value into an value represented by a digit number equal to or lower than the threshold value and an integer represented by a digit number higher than the threshold value;
   generating, as leaves of the tree structured data used in the encoding, a leaf corresponding to the value represented by the digit number equal to or lower than the threshold value and a leaf corresponding to the value represented by the digit number higher than the threshold value; and
   generating the code tree in accordance with the occurrence frequency of the value corresponding to the generated leaf.

7. The encoding method according to claim 1, wherein the distance and the length are further encoded by using a tree structured data, commonly generated to the distance and the length.

8. The encoding method according to claim 1, wherein the distance is a distance from the end of the symbol string that has been utilized for encoding to the beginning of the match symbol string.

9. The encoding method according to claim 1, wherein the distance is a distance from the end of the symbol string that has been utilized for encoding to the end of the match symbol string.

10. A decoding method comprising:
    obtaining a code, the code indicating a distance and a length;
    identifying a symbol present at the distance indicated by the obtained code, from the end of a symbol string resulting from decoding a previously obtained code, by a processor;
    obtaining a symbol string corresponding to the length indicated in the obtained code from the identified symbol; and
    decoding the obtained code into the obtained symbol string.

11. The decoding method according to claim 10, further comprising:
    generating the code by decoding encoded code included in encoded code string.

12. The decoding method according to claim 11, wherein the encoded code is decoded into the code by using a nodeless tree structured data having all leaves coupled immediately below a root of the nodeless tree structured data.

13. A computer-readable recording medium storing encoding program that causes a computer to execute a procedure, the procedure comprising:
    searching a search target symbol string within a specific range from the end of a symbol string that has been utilized for encoding for a match symbol string corresponding to a beginning symbol string of a symbol string to be encoded; and
    encoding the beginning symbol string based on a distance between the match symbol string and the beginning symbol string, and a length of the match symbol string.

14. A computer-readable recording medium storing decoding program that causes a computer to execute a procedure, the procedure comprising:
    decoding each code included in a code string into intermediate codes in order, the code string including a code resulting from encoding an intermediate code including an integer indicating an address and an integer indicating a length so that the integer having a higher frequency occurrence is encoded into a shorter code;
    identifying a symbol present at a distance, corresponding to the integer indicating the address included in an obtained intermediate code, from the end of a symbol string resulting from decoding a previously obtained intermediate code;

obtaining a symbol string corresponding to an integer indicating the length included in the intermediate code from the identified symbol; and decoding the intermediate code into the obtained symbol string.

15. An encoding apparatus comprising:

a memory that a search target symbol string within a specific range from the end of a symbol string that has been utilized for encoding; and a processor that executes a procedure, the procedure including:

searching the search target symbol string stored in the memory for a match symbol string corresponding to a beginning symbol string of a symbol string to be encoded; and encoding the beginning symbol string based on a distance between the match symbol string and the beginning symbol string, a length of the match symbol string.

16. A decoding apparatus comprising:

a memory that stores a code string including a code resulting from encoding an intermediate code including an integer indicating an address and an integer indicating a length so that the integer having a higher frequency occurrence is encoded into a shorter code; and a processor that executes a procedure, the procedure comprising:

decoding each code included in the code string stored in the memory into intermediate codes in order;

identifying a symbol present at a distance, corresponding to the integer indicating the address included in an obtained intermediate code, from the end of a symbol string resulting from decoding a previously obtained intermediate code;

obtaining a symbol string corresponding to an integer indicating the length included in the intermediate code from the identified symbol; and decoding the intermediate code into the obtained symbol string.

17. A system comprising:

a first apparatus and a second apparatus, wherein the first apparatus includes:

a memory that a search target symbol string within a specific range from the end of a symbol string that has been utilized for encoding; and a processor that executes a procedure, the procedure including:

searching the search target symbol string stored in the memory for a match symbol string corresponding a beginning symbol string of a symbol string to be encoded; and encoding the beginning symbol string based on a distance between the match symbol string and the beginning symbol string, and a length of the match symbol string, and wherein the second apparatus includes:

another memory that stores a code string encoded by the encoding of the first apparatus; and another processor that executes another procedure, the another procedure comprising:

decoding each code included in the code string stored in the memory into intermediate codes in order;

identifying a symbol present at a distance, corresponding to the integer indicating the address included in an obtained intermediate code, from the end of a symbol string resulting from decoding a previously obtained intermediate code;

obtaining a symbol string corresponding to an integer indicating the length included in the intermediate code from the identified symbol; and decoding the intermediate code into the obtained symbol string.

18. An encoding method, comprising:

generating an encoded data based on a distance between a first symbol string included in an encoding target data and a second symbol string, which is same as the first symbol string and is anterior to the second symbol string in the encoding target data.

19. A decoding method, comprising:

in a case of obtaining an encoded data indicating a distance between a first symbol string included in an uncoded data and a second symbol string, being same as the first symbol string, included in the uncoded data, generating a third symbol string being same as a fourth symbol string in a decoded data arranged at the distance indicated by the encoded data from the end of the decoded data.

* * * * *